(12) United States Patent
Ono

(10) Patent No.: US 8,013,396 B2
(45) Date of Patent: Sep. 6, 2011

(54) SEMICONDUCTOR COMPONENT AND SEMICONDUCTOR DEVICE

(75) Inventor: Mizuki Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 12/636,090

(22) Filed: Dec. 11, 2009

(65) Prior Publication Data

US 2010/0224935 A1    Sep. 9, 2010

(30) Foreign Application Priority Data

Mar. 5, 2009  (JP) ................. 2009-052371

(51) Int. Cl.
| | |
|---|---|
| *H01L 29/76* | (2006.01) |
| *H01L 29/94* | (2006.01) |
| *H01L 31/119* | (2006.01) |
| *H01L 27/088* | (2006.01) |
| *H01L 29/78* | (2006.01) |

(52) U.S. Cl. ............ 257/368; 257/288; 257/E29.255; 257/E27.06

(58) Field of Classification Search .......... 257/368, 257/288, E29.255, E27.06
See application file for complete search history.

(56) References Cited

U.S. PATENT DOCUMENTS

| | | | |
|---|---|---|---|
| 7,560,758 B2 * | 7/2009 | Zhu et al. ............ | 257/288 |
| 7,803,670 B2 * | 9/2010 | White et al. ........... | 438/151 |

FOREIGN PATENT DOCUMENTS

| | | |
|---|---|---|
| JP | 61-139056 | 6/1986 |
| JP | 9-17962 | 1/1997 |
| JP | 2003-110101 | 4/2003 |
| JP | 2003-115587 | 4/2003 |
| JP | 3658564 | 3/2005 |
| JP | 2005-203798 | 7/2005 |
| JP | 2005-244020 | 9/2005 |
| JP | 2006-191109 | 7/2006 |
| JP | 2007-194337 | 8/2007 |
| JP | 2007-527113 | 9/2007 |
| JP | 2008-504695 | 2/2008 |
| JP | 2008-177529 | 7/2008 |
| JP | 2008-235323 | 10/2008 |
| WO | WO 2005/122272 | 12/2005 |

OTHER PUBLICATIONS

O. Madelung et al., "Numerical Data and Functional Relationships in Science and Technology", Group III: Crystal and Solid State Physics, vol. 22 Semiconductors, Springer-Verlag Berling Heidelberg, 1987, 3 pages.

(Continued)

*Primary Examiner* — Luan C Thai
(74) *Attorney, Agent, or Firm* — Oblon, Spivak, McClelland, Maier & Neustadt, L.L.P.

(57) ABSTRACT

A semiconductor component includes a mixed crystal layer of silicon and germanium having a first main surface, containing a III-group impurity, and having a first face orientation alone represented as a face (11N) by using N satisfying 1.2<N<10 or a face crystallographically equivalent to the face (11N) in the first main surface, a compressive strain being applied to the mixed crystal layer along an in-plane direction, a gate dielectric layer formed on the first main surface. The component further includes a gate electrode formed on the gate dielectric layer, and source/drain regions formed to sandwich the gate electrode in a direction [110] or a crystallographically equivalent direction of the mixed crystal layer and containing a V-group impurity.

20 Claims, 16 Drawing Sheets

OTHER PUBLICATIONS

J.F. Schetzina et al., "Strain Dependence of the Minority Carrier Mobility in p-type Germanium", Physical Review, vol. 181, No. 3, May 15, 1969, pp. 1191-1195.

Toshifumi Irisawa et al., "High Performance Multi-Gate pMOSFETs using Uniaxially-Strained SGOI Channels", Technology Digest of International Electron Device Meeting 2005, 4 pages.

S. M. Sze, "Physics of Semiconductor Devices", John Wiley & Sons, Inc. 1981, 2 pages.

Tsutomu Tezuka et al., "Strain analysis in ultrathin SiGe-on insulator layers formed from strained Si-on-insulator substrates by Ge-condensation process", Applied Physics Letters, vol. 90, 2007, 3 pages.

Seung-Hyun Lim et al., "Si adatom diffusion on Si (100) surface in selective epitaxial growth of Si", Journal of Vacuum Science and Technology B, vol. 21, No. 6, 2003, pp. 2388-2392.

T. Suzuki et al., "REM study of high index Si (5 5 12) flat surfaces", Surface Science, vol. 348, 1996, pp. 335-343.

Office Action issued May 24, 2011, in Application No. 2009-052371, filed Mar. 5, 2009 w/English Translation, 9 pages.

* cited by examiner

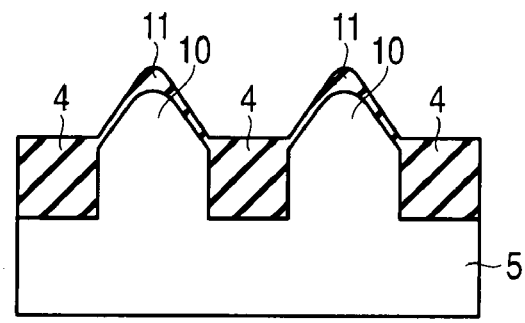
F I G. 9
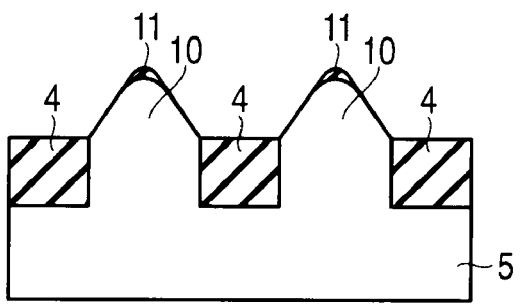
F I G. 10
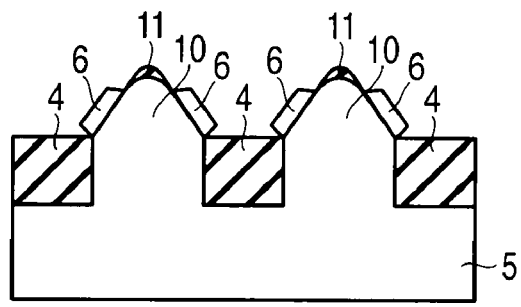
F I G. 11

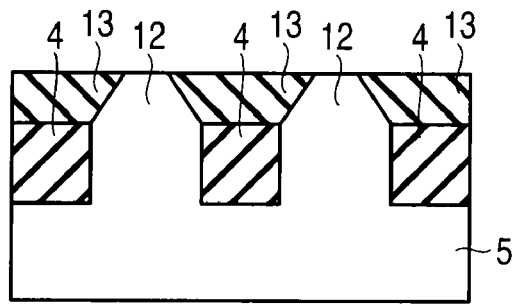
F I G. 14
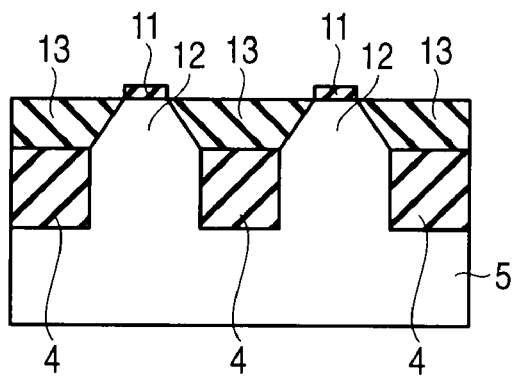
F I G. 15
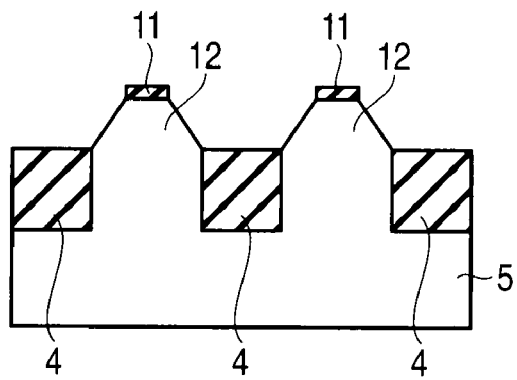
F I G. 16

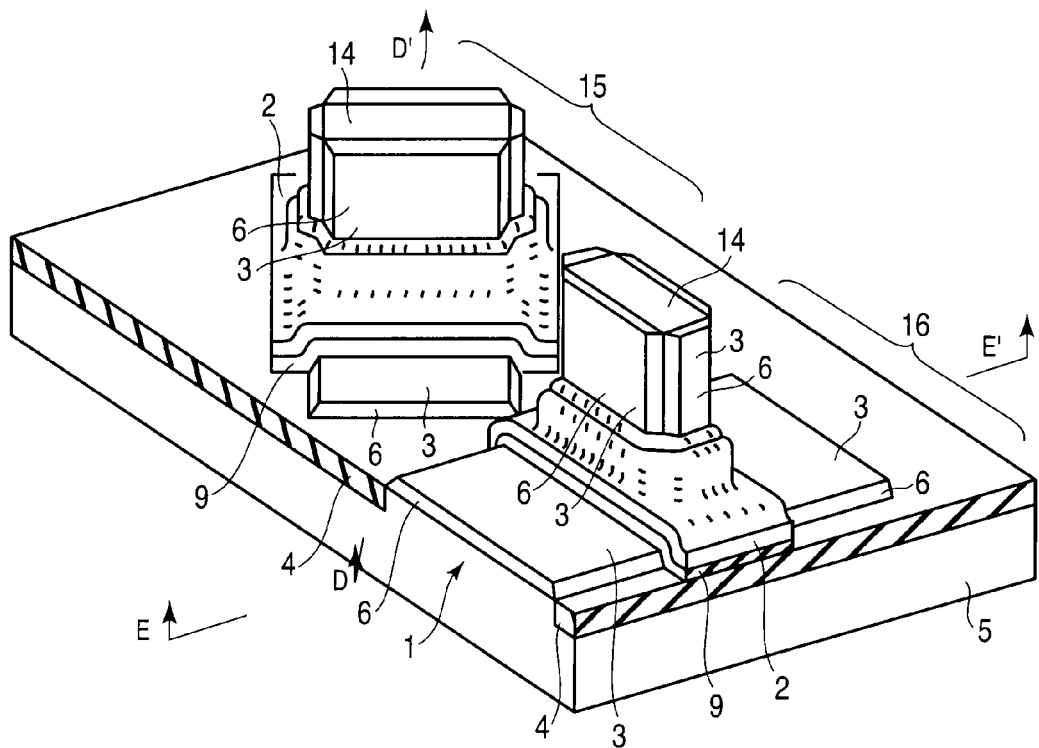
F I G. 28
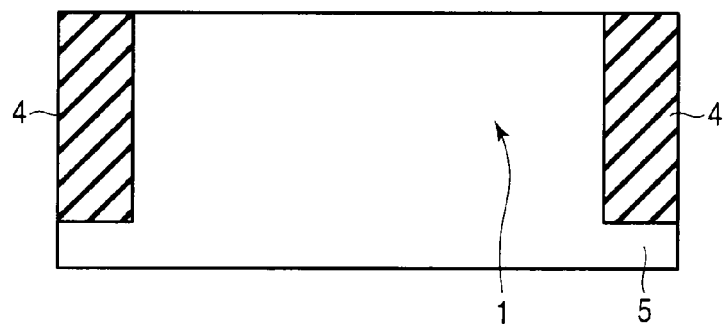
F I G. 29

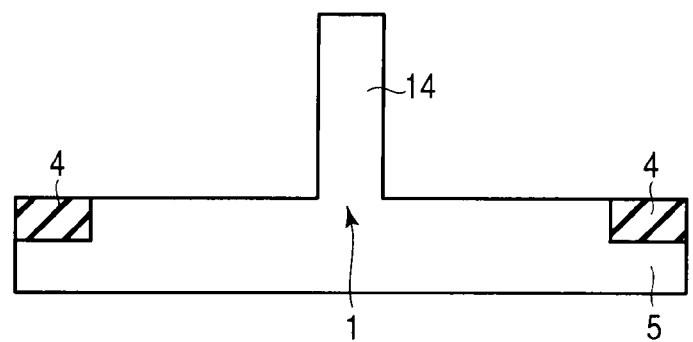
F I G. 30
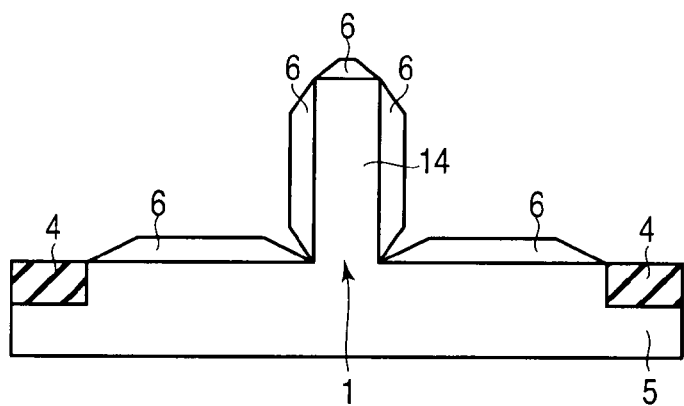
F I G. 31
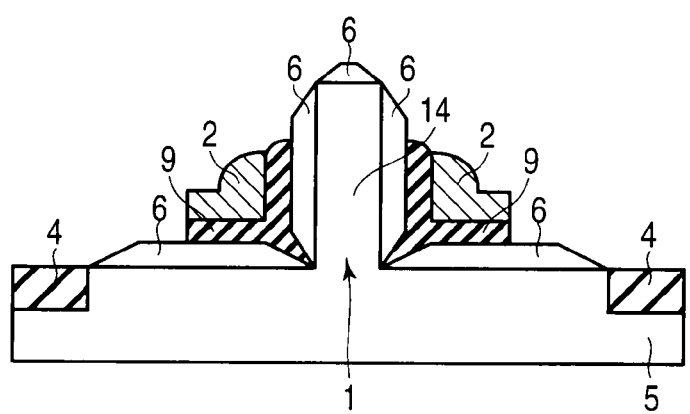
F I G. 32

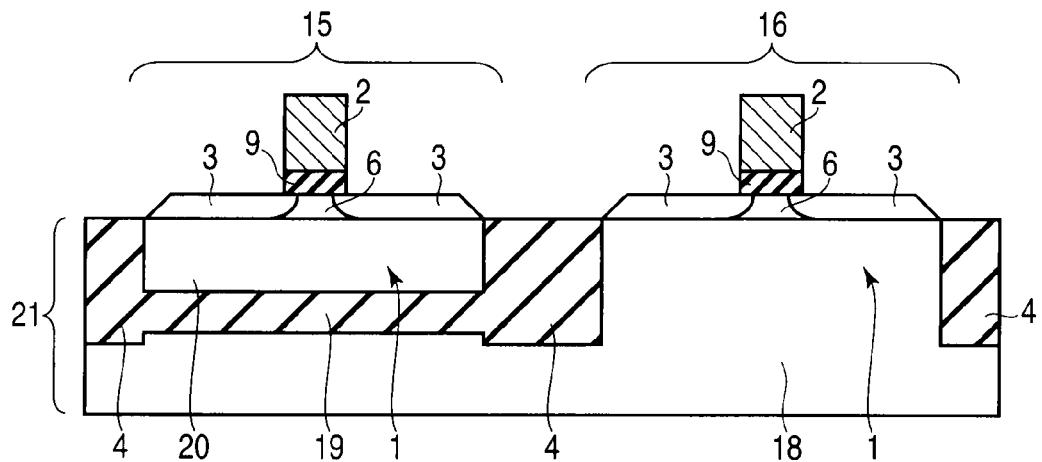
F I G. 33
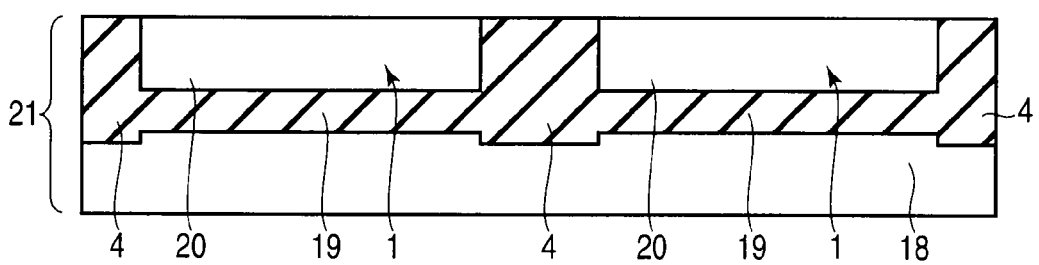
F I G. 34
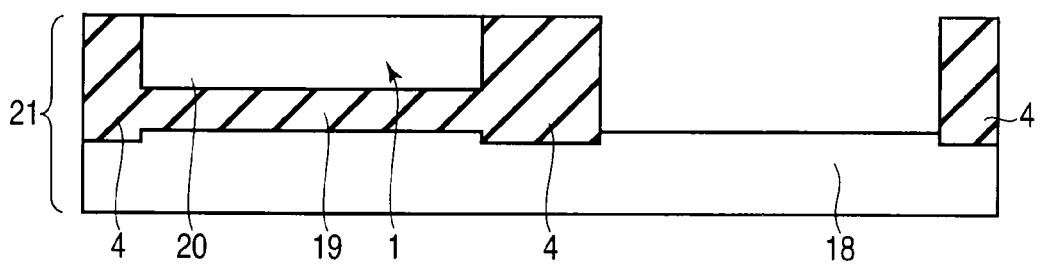
F I G. 35

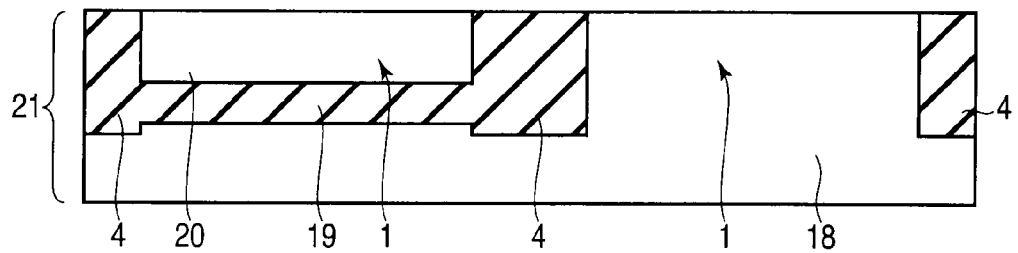
F I G. 36
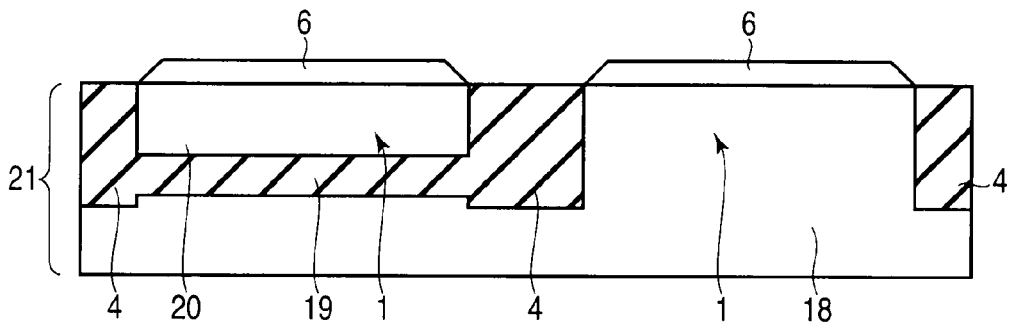
F I G. 37
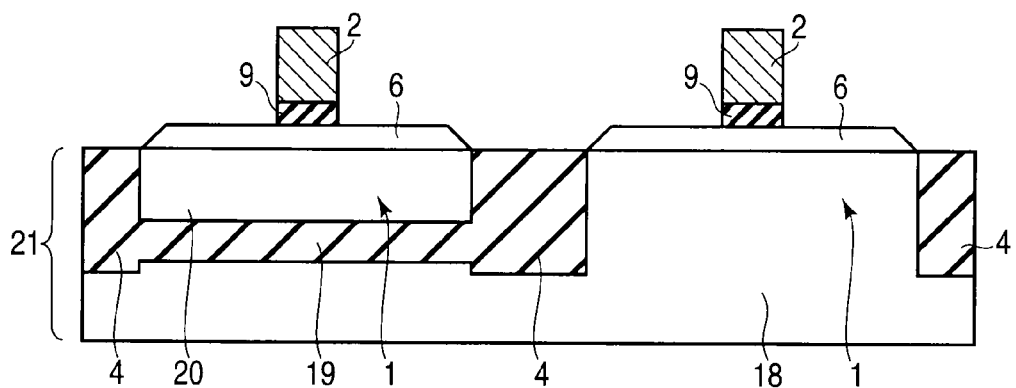
F I G. 38

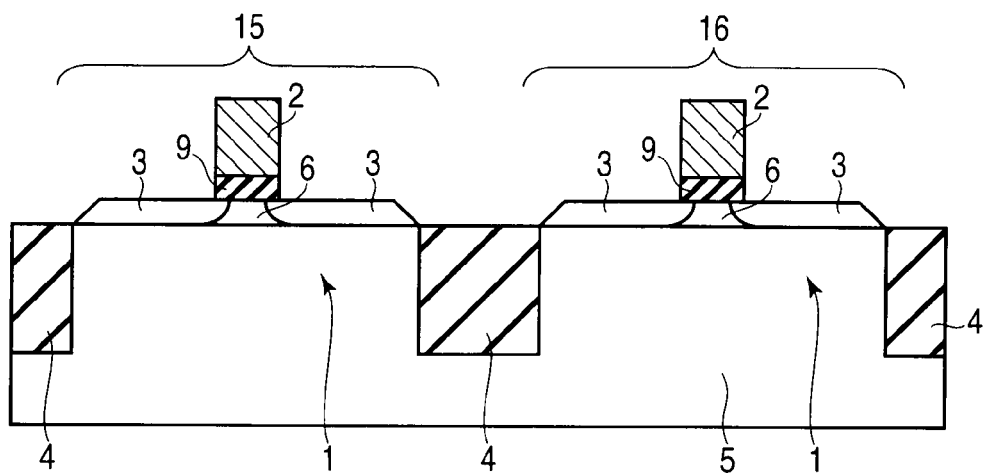
F I G. 39
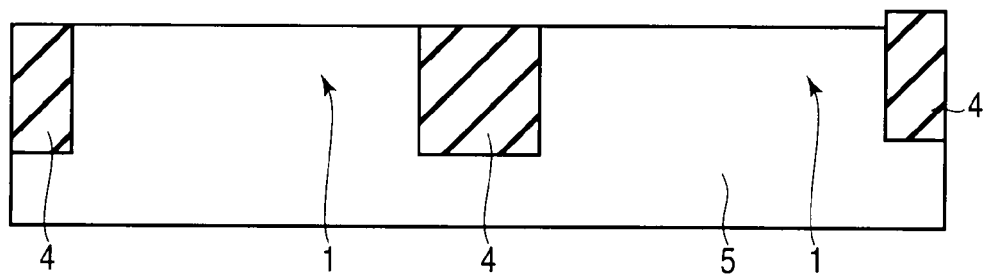
F I G. 40
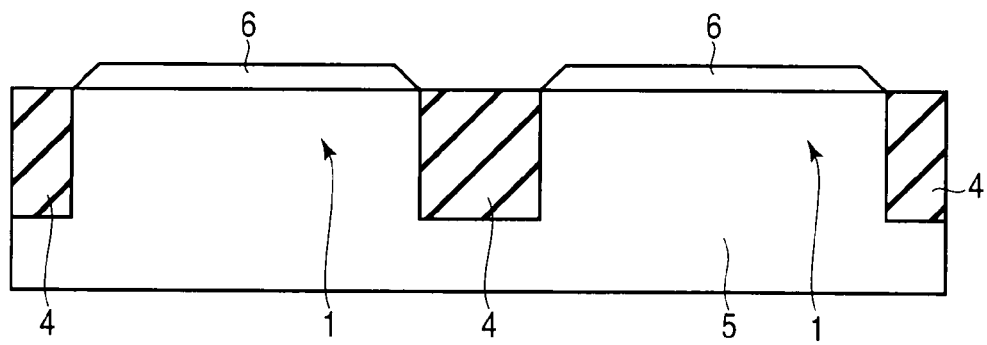
F I G. 41

SEMICONDUCTOR COMPONENT AND SEMICONDUCTOR DEVICE

CROSS-REFERENCE TO RELATED APPLICATIONS

This application is based upon and claims the benefit of priority from prior Japanese Patent Application No. 2009-052371, filed Mar. 5, 2009, the entire contents of which are incorporated herein by reference.

BACKGROUND OF THE INVENTION

1. Field of the Invention

The present invention relates to a semiconductor component and a semiconductor device.

2. Description of the Related Art

A conventional MOS semiconductor component is constituted of source/drain regions formed on a semiconductor substrate mainly consisting of silicon and a gate electrode provided on a channel region between the source/drain regions through a gate dielectric layer. A current flowing through the channel region is controlled by controlling a potential in the channel region based on capacitive coupling between the gate electrode and the channel region through the gate dielectric layer. Further, miniaturization of the component has been advanced in order to improve the performance of the component.

However, it cannot be said that the mobility of electrons or holes that move in a semiconductor is high, thus there is a problem that the desired current drivability cannot be obtained. As a countermeasure, a method of using a semiconductor other than silicon for a channel region to obtain high mobility and thereby realizing high current drivability has been examined.

Further, there has been also examined a method of applying a strain to a semiconductor material and thereby modulating a band structure in a semiconductor to obtain high mobility, thus realizing high current drivability. Furthermore, in a p-type semiconductor component in which a current is mainly carried by holes, there is known a technology in which germanium or a mixed crystal of germanium and silicon is used to form a component on a face (110) or a face having a face orientation crystallographically equivalent to the former face, a channel is formed in a direction [110] or a direction crystallographically equivalent to the former direction, and compressive strain is applied in a channel length direction to obtain high mobility (see, e.g., T. Irisawa, et al., "High Performance Multi-Gate pMOSFETs using Uniaxially-Strained SGOI Channels," in Tech. Dig. of International Electron Device Meeting 2005 pp. 727-730).

A compressive strain can be applied to a semiconductor on which a component is to be formed by providing a semiconductor layer where a component is to be formed on a semiconductor having a lattice constant smaller than that of the semiconductor based on, e.g., epitaxial growth. As a combination adopted when epitaxially growing a semiconductor having a larger lattice constant on a semiconductor having a smaller lattice constant, there is the following combination, for example. That is, it is possible to take a combination that a mixed crystal having a composition ratio of silicon with respect to germanium represented as $(1-y)/Y$ (y satisfies $x<y\leq1$) is epitaxially grown on a mixed crystal having a composition ratio of germanium with respect to silicon represented as $x/(1-x)$ (x satisfies $0\leq x<1$). Here, lattice constants of silicon and germanium are 0.543 nm and 0.565 nm, respectively. It is known that a lattice constant of a mixed crystal can be obtained by performing linear interpolation with respect to the lattice constants of silicon and germanium in accordance with a composition ratio of these materials.

When x mentioned above is 0 in particular, i.e., when a substrate is formed of pure silicon, a silicon substrate which is extensively utilized in conventional semiconductor components can be used, and hence there is an advantage that formation can be particularly facilitated.

It is to be noted that pure silicon or pure germanium is not usually called a mixed crystal, but each of such pure materials is considered as a special case in which a composition ratio of germanium or silicon is zero, and the pure silicon or the pure germanium is also included in the mixed crystal in this specification.

Although high mobility can be obtained by using germanium for a channel in a p-type semiconductor component and applying compressive strain in a lengthwise direction of the channel as explained above, a strain application method that can obtain such high mobility is not known in an n-type semiconductor component. Therefore, the n-type semiconductor component has a problem that realizing high current drivability is difficult and configuring a complementary semiconductor component is particularly difficult.

Accordingly, there has been demanded realization of a high-performance complementary semiconductor device which can perform a high-speed operation that enables obtaining high mobility to provide an n-type semiconductor component having high current drivability by applying compressive strain to a channel even in the n-type semiconductor component and enables obtaining high current drivability in both the n-type and p-type semiconductor components by applying compressive strain to the n-type semiconductor component as well as the p-type semiconductor component.

BRIEF SUMMARY OF THE INVENTION

According to one aspect of the invention, there is provided a semiconductor component, which includes:

a mixed crystal layer of silicon and germanium having a first main surface, containing a III-group impurity, and having a first face orientation alone which is represented as a face (11N) by using N satisfying $1.2<N<10$ or which is crystallographically equivalent to the face (11N) in the first main surface, a compressive strain being applied to the mixed crystal layer along an in-plane direction;

a gate dielectric layer formed on the first main surface;

a gate electrode formed on the gate dielectric layer; and source/drain regions formed to sandwich the gate electrode in a direction [110] or a crystallographically equivalent direction of the mixed crystal layer and containing a V-group impurity.

It is to be noted that, in this specification, the term "main surface" is designated as a surface having a surface orientation accompanied with the greatest area. Further, pure silicon or pure germanium is not called as a mixed crystal, in general. However, in this specification, the term "mixed crystal" includes pure silicon and pure germanium, assuming as a special case the composition ratio of silicon or germanium is zero.

BRIEF DESCRIPTION OF THE SEVERAL VIEWS OF THE DRAWING

FIGS. 7 to 11 are cross-sectional views for explaining a manufacturing process of the semiconductor component according to the second embodiment in stages;

FIGS. 13 to 16 are cross-sectional views for explaining a manufacturing process of the semiconductor component according to the third embodiment in stages;

FIG. 28 is a perspective view for explaining a configuration of a semiconductor device according to a fifth embodiment;

FIGS. 29 to 32 are cross-sectional views for explaining a manufacturing process of a semiconductor component according to the fifth embodiment in stages;

FIG. 33 is a cross-sectional view for explaining a configuration of a semiconductor device according to a sixth embodiment;

FIGS. 34 to 38 are cross-sectional views for explaining a manufacturing process of the semiconductor device according to the sixth embodiment in stages;

FIG. 39 is a cross-sectional view for explaining a configuration of a semiconductor device according to a seventh embodiment; and FIGS. 40 to 42 are cross-sectional views for explaining a manufacturing process of the semiconductor device according to the seventh embodiment in stages.

DETAILED DESCRIPTION OF THE INVENTION

Embodiments according to the present invention will now be described hereinafter in detail with reference to the accompanying drawings. It is to be noted that the drawings are schematic, and a relationship between a thickness and a planar dimension, a ratio of a thickness of each layer, etc., are different from actual values. Therefore, specific thicknesses or dimensions should be determined while making reference to the following description. Further, it is to be also noted that the drawings include parts having different relationships or dimensional ratios.

First Embodiment

Figure 1:
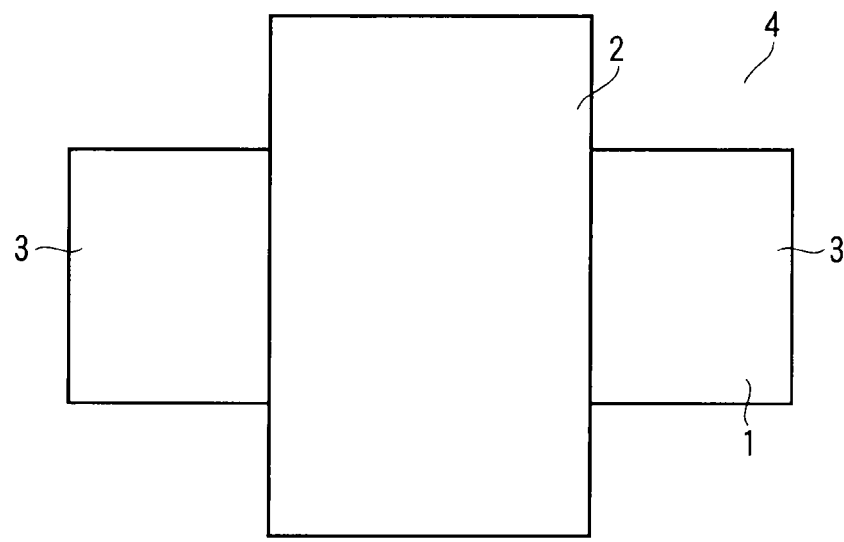
FIG. 1 is a plan view for explaining a configuration of a semiconductor component according to a first embodiment.

FIG. 1 is a schematic plan view of a semiconductor component according to a first embodiment. Note that an interlayer dielectric layer, a wiring metal, and other parts are omitted in the drawing. This semiconductor component is formed on a face of a mixed crystal of silicon and germanium which is represented as a face (11N) by using N satisfying 1.2<N<10 or on a face of the same having a face orientation crystallographically equivalent to the former face.

In FIG. 1, reference numeral 1 denotes an active area, and a gate electrode 2 is formed on this region through a non-illustrated gate dielectric layer. Source/drain regions 3 are formed on the active area 1 to sandwich the gate electrode 2. A direction along which the source/drain regions are connected via the gate electrode 2 is made to be a direction [110] and a direction crystallographically equivalent to the former direction.

Moreover, the active area 1 including the source/drain regions 3 is surrounded by an isolation region 4 formed of, e.g., a silicon oxide, and a compressive strain is applied in an in-plane direction. Here, applying the compressive strain in a specific in-plane direction means the following state. An x axis and a y axis are taken in this specific face, and a z axis is taken to be vertical to this specific face. Although strain is generally represented as a tensor of degree 2, the x axis and the y axis are selected in such a manner that this tensor is diagonalized when an xx component, an xy component, and a yy component of the strain are considered like the tensor of degree 2 defined in an xy plane. A state in which the xx component and the yy component of the tensor is negative in the x axis, the y axis, and the z axis selected in this manner means that the compressive strain is applied in this specific face in this specification. Our examination has revealed that a high electron mobility can be obtained when a compressive strain is applied in this manner. This matter will now be described hereinafter.

Figure 2:
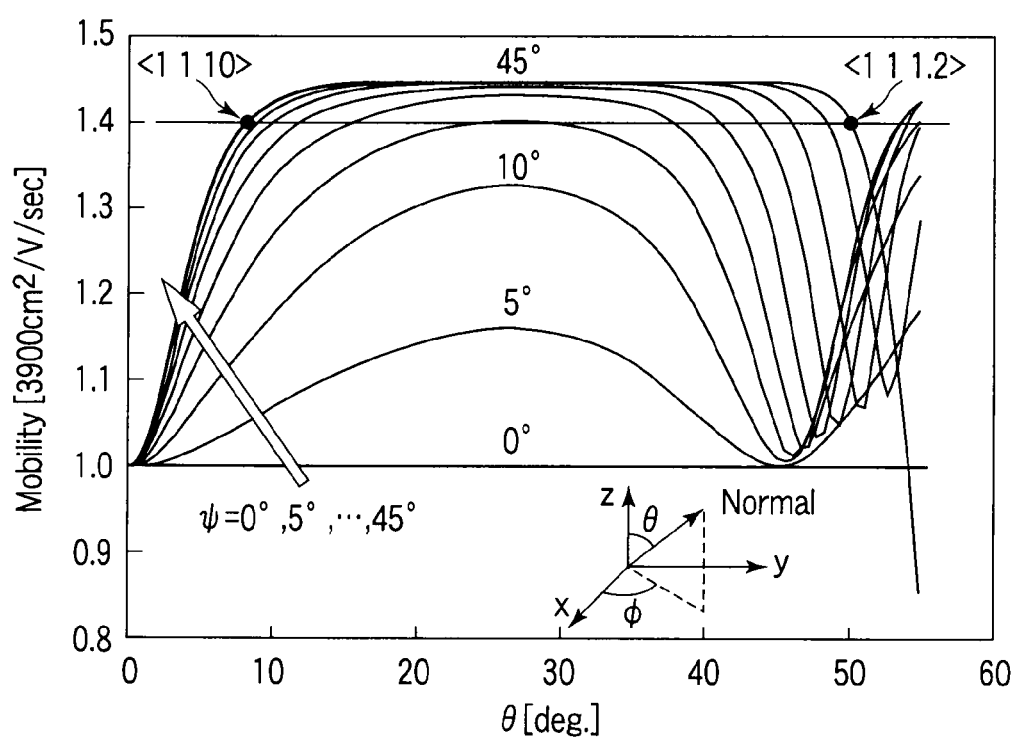
FIG. 2 is a characteristic view showing dependence of mobility of electrons with respect to a direction of a face to which an isotropic biaxial compressive strain is applied.

The behavior of the mobility of electrons when an isotropic biaxial compressive strain is applied to germanium was examined based on a calculation. In this examination, energy at each local minimum point was obtained by utilizing an influence of the strain with respect to each local minimum point of a conduction band of germanium by using a deformation potential. A share of electrons at each local minimum point was obtained based on the thus acquired energy value, and a weighted average of contribution of the respective local minimum points to the mobility was calculated to obtain the mobility of electrons. FIG. 2 shows the result.

Here, the isotropic biaxial compressive strain means the same compressive strain of an xx component and a yy component in a specific face, as mentioned above. It is to be noted that the mobility of electrons in a specific face is dependent on a moving direction in this face when the strain is applied. Here, a value of the largest mobility in the face is shown. A direction of the face is specified by an azimuth angle φ and a zenithal angle θ of a normal line of the face as shown in an inset to FIG. 2.

In FIG. 2, φ is changed as a parameter at intervals of 5°, and the dependence of the mobility of electrons in a direction of the face with respect to θ is shown. It is to be noted that φ is changed from 0° to 45° and θ is changed from 0° to 54.7°, respectively. Considering symmetry properties of the crystal, all face orientations or faces crystallographically equivalent to these faces are included in this range. Note that the mobility of electrons in germanium to which the strain is not applied is isotropic, and its value is approximately 3900 $cm^2/V/s$ (see, e.g., "Numerical Data and Functional Relationships in Science and Technology, edited by O. Madelung, Springer-Verlag Berlin Heidelberg 1987").

In FIG. 2, the ordinate represents the mobility of electrons normalized by a value in germanium to which the strain is not applied. Note that FIG. 2 shows a result obtained by assuming a situation where a 4% compressive strain is applied to germanium epitaxially grown on silicon. Additionally, in this calculation, a value of 19.4 is used as a ratio of a longitudinal effective mass of a constant-energy surface and a transverse effective mass of the same in a valley of a conduction band of the germanium, and a value of 1.4 is used as a ratio of a relaxation time in the longitudinal direction and a relaxation time in the transverse direction (see, e.g., J. F. Schetzina, et al., "Strain Dependence of the Minority Carrier Mobility in p-type Germanium," in Physical Review, vol. 181 No. 3 (1969) pp. 1191-1195).

FIG. 2 shows that the mobility increases as the azimuth angle φ of the face increases. Further, when the azimuth angle φ is 45°, the mobility has a substantially fixed value in a given range of the zenithal angle θ. This is the maximum mobility expected in germanium, and its value is approximately 1.448 times that obtained when no strain is applied.

Here, in view of the fact that an effective digit number of the ratio of the relaxation time in the longitudinal direction and the relaxation time in the transverse direction in the valley of the conduction band of germanium is 2, the value of the mobility is considered to have two effective digits. Obtaining a range in which the value of the mobility becomes 1.4 times or above that when no strain is applied results in a face represented as a face (11N) by using N satisfying 1.2<N<10 or a face having a face orientation crystallographically equivalent to the former face.

N is obtained as follows. First, a range that a value of a curve (the uppermost curve) having φ=45° becomes 1.4 or above on the ordinate is obtained. That is, when an abscissa coordinate of an intersection of the curve having φ=45° and a straight line having an ordinate value of 1.4 is read, 8.21°<θ<49.8° is obtained. In general, since a value of a tangent of an azimuth angle of a normal line of the face (11N) is given based on $2^{1/2}$/N, N can be obtained by dividing $2^{1/2}$ by the tangent of the azimuth angle. Therefore, the value of N to be obtained is 1.2<N<10.

Accordingly, when configuring an n-type semiconductor component of germanium, a high mobility can be obtained by using a face in this range to apply a compressive strain in an in-plane direction, whereby a component having high current drivability can be realized.

Further, in view of the fact that the effective digit number of the ratio of the relaxation time in the major axis direction and the relaxation time in the minor axis direction is 2 and the effective digit number of the ratio of the effective mass of the constant-energy surface in the major axis direction and the effective mass of the same in the minor axis direction is 4 in the valley of the conduction band of germanium, the value of the mobility is considered to have 3 effective digits. When a range in which a value of the mobility becomes 1.44 times or above that when no strain is applied is obtained, a face represented as the face (11N) by using N that satisfies 1.3<N<6 and a face having a face orientation crystallographically equivalent to this face is provided. Therefore, when configuring the n-type semiconductor component of germanium, there can be obtained an advantage that higher mobility can be obtained by using a face in this range and applying the compressive strain in the in-plane direction, resulting in that a component having higher current drivability is thereby realized.

Furthermore, in view of the fact that the effective digit number of the ratio of the effective mass of the constant-energy surface in the longitudinal direction and the effective mass of the same in the transverse direction in the valley of the conduction band of germanium, the mobility is considered to have 4 effective digits. When a fifth digit of a value of the mobility is rounded to the nearest integer and a range that the value of the mobility becomes 1.448 times or above of that when no strain is applied is obtained, a face represented as a face (11N) by using N that satisfies 1.6<N<3.7 or a face having a face orientation crystallographically equivalent to this face is provided. Therefore, when configuring the n-type semiconductor component of germanium, there can be obtained an advantage that higher mobility is obtained by using a face in this range and applying compressive strain in the in-plane direction, resulting in that a component having higher current drivability is thereby realized.

It is to be noted that FIG. 2 shows a result when the 4% compressive strain is applied in a strain-free state. However, a mobility that is 1.4 times or above that when no strain is applied is realized if the strain is 1.4% or above, a mobility that is 1.44-fold or above that when no strain is applied is realized if the strain is 1.9% or above, a mobility that is 1.448-fold or above that when no strain is applied is realized if the strain is 3.5% or above. Therefore, it is preferable for the strain to have a value of 1.4% or above, more preferable for the same to have a value of 1.9% or above, and further preferable for the same to have a value of 3.5% or above.

It is to be noted that substantially the same result can be obtained when the semiconductor is a mixed crystal of silicon and germanium, although the result obtained when the semiconductor is germanium alone has been described. This result is information discovered by the above examination.

Moreover, it has been revealed that the mobility does not become isotropic when the strain is applied as explained above but a direction in which the maximum mobility can be obtained in the face is always the direction [110] or a direction crystallographically equivalent to this direction irrespective of the zenithal angle θ when the azimuth angle is 45°. This result is also information discovered by the above examination.

Incidentally, it is known that defects are apt to be generated when a strain exceeding approximately 2% to 2.3% is applied to a mixed crystal of silicon and germanium (see, e.g., T. Tezuka, et al., "Strain analysis in ultrathin SiGe-on-insulator layers formed from strained Si-on-insulator substrates by Ge-condensation process," in Applied Physics Letters, vol. 90 (2007) pp. 181918-1-3). Therefore, it is preferable for the strain applied to the mixed crystal of silicon and germanium configuring the semiconductor component to be approximately 2.3% or below, and more preferable for the same to be approximately 2% or below.

Note that, when a face orientation is represented as (abc), all of a, b, and c are usually represented as integers. However, a ratio of a, b, and c alone is essential to specify the face orientation, and hence a situation where a, b, and c are not necessarily integers is also included in the explanation of this specification.

Further, a face crystallographically equivalent to the face (abc) is a generic designation of a face (abc), a face (-abc), a face (a-bc), a face (ab-c), a face (acb), a face (-acb), a face (a-cb), a face (ac-b), a face (bac), a face (-bac), a face (b-ac), a face (ba-c), a face (bca), a face (-bca), a face (b-ca), a face (bc-a), a face (cab), a face (-cab), a face (c-ab), a face (ca-b), a face (cba), a face (-cba), a face (c-ba), and a face (cb-a). It is to be noted that the face (abc) and a face (-a-b-c) generally represent the same face.

Additionally, the direction crystallographically equivalent to the direction [abc] is a generic designation of a direction [abc], a direction [-abc], a direction [a-bc], a direction [ab-c], a direction [acb], a direction [-acb], a direction [a-cb], a direction [ac-b], a direction [bac], a direction [-bac], a direction [b-ac], a direction [ba-c], a direction [bca], a direction [-bca], a direction [b-ca], a direction [bc-a], a direction [cab], a direction [-cab], a direction [c-ab], a direction [ca-b], a direction [cba], a direction [-cba], a direction [c-ba], and a direction [cb-a]. It is to be noted that the direction [abc] and a direction [-a-b-c] generally represent the same direction.

In the faces each represented as the face (11N) by using N that satisfies 1.2<N<10, as faces which are represented by relatively simple integers alone, there are, e.g., a face (112), a face (113), a face (114), a face (115), a face (116), a face (117), a face (118), a face (119), a face (223), a face (225), a face (227), a face (229), a face (2,2,11), a face (2,2,13), a face (2,2,15), a face (2,2,17), a face (2,2,19), a face (334), a face (335), a face (337), a face (338), a face (3,3,10), a face (3,3,11), a face (3,3,13), a face (3,3,14), a face (3,3,16), a face (3,3,17), a face (3,3,19), a face (445), a face (447), a face (449), a face (4,4,11), a face (4,4,13), a face (4,4,15), a face (4,4,17), a face (4,4,19), a face (557), a face (558), a face (559), a face (5,5,11), a face (5,5,12), a face (5,5,13), a face (5,5,14), a face (5,5,16), a face (5,5,17), a face (5,5,18), a face (5,5,19), a face (6,6,11), a face (6,6,13), a face (6,6,17), a face (6,6,19), a face (7,7,9), a face (7,7,10), a face (7,7,11), a face (7,7,12), a face (7,7,13), a face (7,7,15), a face (7,7,16), a face (7,7,17), a face (7,7,18), a face (7,7,19), a face (8,8,11), a face (8,8,13), a face (8,8,15), a face (8,8,17), a face (8,8,19), a face (9,9,11), a face (9,9,13), a face (9,9,14), a face (9,9,16), a face (9,9,17), a face (9,9,19), etc., or faces crystallographically equivalent to these faces. Incidentally, it is known that, when selective epitaxial growth is carried out with respect to a face (100) or a specific region on silicon crystallographically equivalent to this face, the face (113), the face (5,5,12), or a face crystallographically equivalent to each of these faces often appears near a boundary of the region (see, e.g., S.-H Lim, et al., "Si adatom diffusion on Si (100) face in selective epitaxial growth of Si," in Journal of Vacuum Science and Technology B, vol. 21 No. 6 (2003) pp. 2388-2392, or T. Suzuki, et al., "REM study of high index Si (5 5 12) flat surfaces," in Surface Science, vol. 348 (1996) pp. 335-343).

Figure 3:
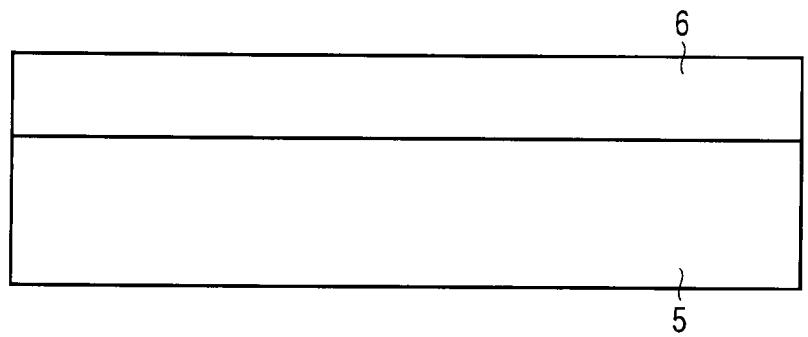
FIGS. 3 to 5 are cross-sectional views for explaining a manufacturing process of a semiconductor component according to the first embodiment in stages.

A manufacturing method of a semiconductor component according to this embodiment will now be described. First, as shown in FIG. 3, for example, an epitaxial growth method is used for forming a mixed crystal layer 6 of silicon and germanium, which will be referred to as SiGe hereinafter, having silicon and germanium composition ratios of 0.5 and 0.5, respectively, on a silicon substrate 5 having a face (311) or a face orientation crystallographically equivalent to this face by utilizing, e.g., an $SiH_4$ gas, a $GeH_4$ gas, and an HCl gas.

Figure 4:
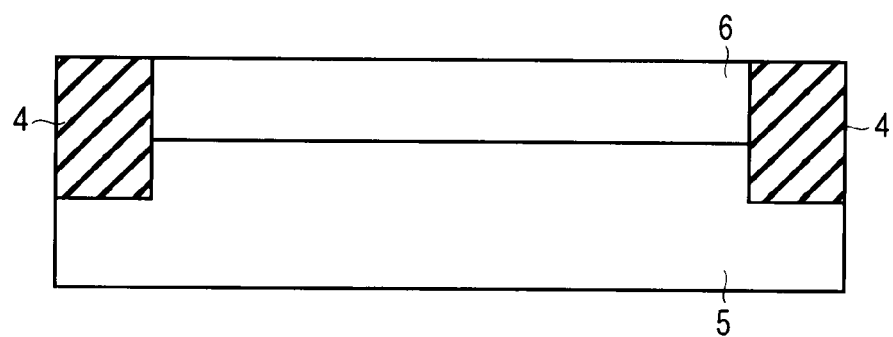

Then, as shown in FIG. 4, isolation regions 4 are formed by, e.g., a shallow trench method. Subsequently, for example, $1 \times 10^{12}/cm^2$ of B (boron) ions (not shown) are implanted into the silicon substrate 5 and the SiGe layer 6 with an energy of, e.g., 5 keV.

Figure 5:
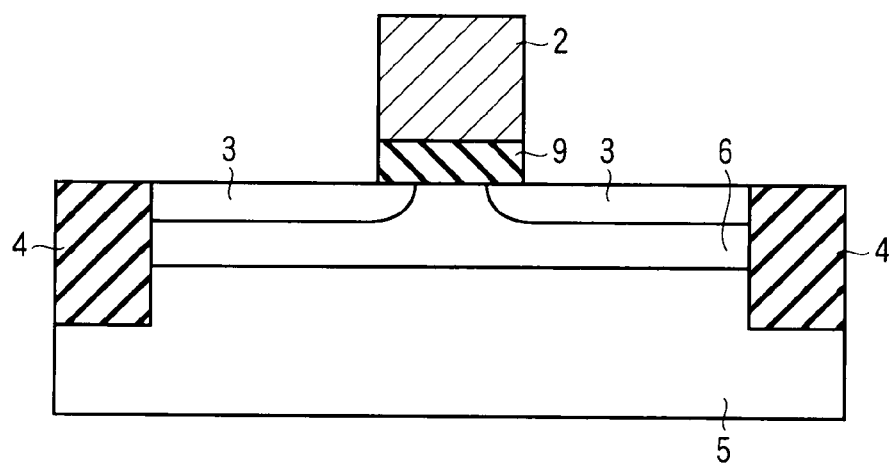

Then, as shown in FIG. 5, for example, a hafnium oxide film having a thickness of, e.g., 5 nm is formed on the entire surface of the SiGe layer 6 including the isolation regions 4 by using, e.g., a chemical vapor deposition (CVD) method. Subsequently, a W (tungsten) film having a thickness of 10 nm is formed on the entire surface of the hafnium film by, e.g., the CVD method. Then, anisotropic etching, e.g., a reactive ion etching (RIE) method is carried out to process the W film and the hafnium oxide film, thereby forming a gate electrode 2 and a gate dielectric layer 9. Subsequently, for example, $1 \times 10^{15}/cm^2$ of As (arsenic) ions are implanted with an energy of 10 keV to form source/drain regions 3. Thereafter, a semiconductor component according to this embodiment depicted in FIG. 1 is formed through an interlayer dielectric layer forming process or a wiring process, as in the conventional technology.

In this embodiment, although an n-type semiconductor component has been taken as an example, when a method such as a photoengraving or lithography process is used to introduce an impurity into a specific region alone in the substrate, a p-type semiconductor component can be configured besides the n-type semiconductor component, and not only the n-type semiconductor component but also the p-type semiconductor component can be utilized in a semiconductor apparatus.

Further, in this embodiment, the situation where the semiconductor component is formed on a bulk semiconductor substrate has been described, but the same effect can be obtained even if the semiconductor component is formed on, e.g., an SOI substrate. When the semiconductor component is formed on an SOI substrate, an impurity concentration in a channel region present between source/drain regions can be set low, and hence an advantage that the mobility can be further improved can be obtained. On the other hand, when the semiconductor component is formed on the semiconductor substrate, as in this embodiment, another advantage that application of a substrate bias can be facilitated is obtained.

Moreover, in this embodiment, the process of forming the single semiconductor component alone has been described, but this process can be likewise used when forming a semiconductor component as a part of a semiconductor device including an active component such as a field-effect transistor, a bipolar type transistor, or a single-electron transistor, a passive component such as a resistor, a diode, an inductor, or a capacitor, a semiconductor storage component, a component using a ferroelectric substance, or a component using a magnetic substance besides the single semiconductor component. Further, this process can be likewise applied when forming a semiconductor component as a part of an optoelectrical integrated circuit (OEIC) or a micro-electromechanical system (MEMS).

Additionally, although As is used as an impurity for forming the n-type semiconductor layer and B is used as an impurity for forming the p-type semiconductor layer in this embodiment, any other V-group impurity may be used as an impurity for forming the n-type semiconductor layer, or any other III-group impurity may be used as an impurity for forming the p-type semiconductor layer. Further, a III-group or V-group impurity may be introduced in the form of a compound containing such an impurity.

Furthermore, although the impurity is introduced into the source and the drain by using ion implantation in this embodiment, a method other than ion implantation, e.g., solid phase diffusion or vapor phase diffusion may be adopted. Moreover, a method of, e.g., depositing or growing a semiconductor containing an impurity may be used. When the ion implantation method is used, an advantage that forming a complementary semiconductor device containing the n-type semiconductor component and the p-type semiconductor component is facilitated can be obtained. When a method, e.g., deposition of a semiconductor containing an impurity, solid phase diffusion, or vapor phase diffusion is utilized to introduce the impurity, an advantage that realizing a high impurity concentration can be easily obtained.

Additionally, although introduction of an impurity for adjusting a threshold voltage of the component is not performed in this embodiment, such a process may be carried out separately from introduction of the impurity into the silicon substrate before forming the gate electrode. When such a process is adopted, an advantage that the threshold voltage is easily set to a desired value can be obtained. Further, when this embodiment is adopted, an advantage that the process is facilitated can be obtained.

Furthermore, although the SiGe layer having the silicon and germanium composition ratios of 0.5 and 0.5, respectively, is formed on the silicon substrate based on the epitaxial growth in this embodiment, this is not essential, and an SiGe layer having silicon and germanium composition ratios of $1-x$ and x ($y < x \leq 1$), respectively, may be generally formed on an SiGe layer having silicon and germanium composition ratios of 1−y and y (0≦y<1) based on the epitaxial growth.

Since the essence of the present embodiment lies in that a compressive strain in the in-plane direction is applied to the formed SiGe layer of the semiconductor component, a situation that a germanium composition ratio in the SiGe layer formed based on epitaxial growth is higher than a germanium composition ratio of the underlying SiGe layer.

Further, in view of the preferable range of a strain amount, it is desirable for a difference x-y between x and y to be 0.35 or above, more desirable for the same to be 0.47 or above, and further preferable for the same to be 0.87 or above based on conditions that enable obtaining a high value of electron mobility. Furthermore, it is desirable for the difference x-y between x and y to be 0.575 or below and more desirable for the same to be 0.5 or below based on conditions that reduce the occurrence of defects in the SiGe layer formed by the epitaxial growth.

Moreover, since a silicon substrate which is extensively used in conventional semiconductor devices can be utilized when pure silicon is adopted as an underlying material, as in this embodiment, there can be obtained an advantage that the purveyance of the underlying material is easy.

Additionally, although the SiGe layer is epitaxially grown and then device isolation is carried out in this embodiment, the device isolation may be performed prior to the epitaxial growth of the SiGe layer.

Further, the $SiH_4$ gas, the $GeH_4$ gas, and the HCl gas are used when epitaxially growing the SiGe layer, but source gases for the epitaxial growth are not restricted to these materials. For example, $Si_2H_6$, $Si_3H_8$, or $Si_4H_{10}$ may be used or a gaseous mixture of these materials may be adopted in place of $SiH_4$.

Further, $Ge_2H_6$, $Ge_3H_8$, or $Ge_4H_{10}$ may be used or a gaseous mixture of these materials may be adopted in place of $GeH_4$. Furthermore, $Cl_2$, etc. may be used or a gaseous mixture of these materials may be adopted in place of HCl. Moreover, for example, $SiH_2Cl_2$ or $GeCl_4$ may used.

When device isolation is carried out prior to the epitaxial growth of the SiGe layer, an upper side of the device region alone must be subjected to the epitaxial growth, and hence a gas containing Cl must be used. In this case, for example, when $SiH_2Cl_2$ or $GeCl_4$ is used, the epitaxial growth can be performed with respect to the upper side of the device region without using HCl or $Cl_2$ in addition to these materials, there is an advantage that the process can be facilitated.

On the other hand, when, e.g., HCl or $Cl_2$ is used in addition to a material, e.g., $SiH_4$, $Si_2H_6$, $Si_3H_8$, or $Si_4H_{10}$ or a material, e.g., $GeH_4$, $Ge_2H_6$, $Ge_3H_8$, or $Ge_4H_{10}$, the ratio of Si or Ge and Cl can be arbitrarily adjusted, and hence an advantage that control over epitaxial growth conditions for the SiGe layer is facilitated can be obtained.

Additionally, for example, $SiGeH_6$ or the like may be used in place of the gaseous mixture of $SiH_4$, $Si_2H_6$, $Si_3H_8$, or $Si_4H_{10}$ or the gaseous mixture of $GeH_4$, $Ge_2H_6$, $Ge_3H_8$, or $Ge_4H_{10}$. When $SiGeH_6$ or the like is used, an advantage that the process is facilitated can be obtained.

On the other hand, for example, $SiGeH_6$ or the like may be used in place of the gaseous mixture of $SiH_4$, $Si_2H_6$, $Si_3H_8$, or $Si_4H_{10}$ or the gaseous mixture of $GeH_4$, $Ge_2H_6$, $Ge_3H_8$, or $Ge_4H_{10}$. When $SiGeH_6$ or the like is used, an advantage that process is simplified is obtained. On the other hand, the gaseous mixture of $SiH_4$, $Si_2H_6$, $Si_3H_8$, or $Si_4H_{10}$ or the gaseous mixture of $GeH_4$, $Ge_2H_6$, $Ge_3H_8$, or $Ge_4H_{10}$ or the like is used, an advantage that control over a composition ratio of silicon and germanium in the SiGe layer to be formed is facilitated can be obtained.

Further, although the device having a single-drain structure has been described in this embodiment, a device having a structure other than the single-drain structure, e.g., an extension structure may be configured. Furthermore, a device having, e.g., a halo structure may be configured. Adopting such structures are preferable since the tolerance to a short channel effect of the device can be further improved.

Furthermore, although the source/drain regions are formed after processing the gate electrode or the gate dielectric layer in this embodiment, this order is not essential, and a reverse order may be adopted. Performing a thermal process may not be preferable depending on a material of the gate electrode or the gate dielectric layer. In such a case, it is preferable to perform the thermal process for introduction of the impurity into the source/drain regions or activation prior to processing the gate electrode or the gate dielectric layer.

Although tungsten is utilized to form the gate electrode in this embodiment, any other material may be used for forming the gate electrode. Moreover, the gate electrode may be formed by using a semiconductor such as single-crystal silicon or amorphous silicon, a compound containing a metal, or a lamination of such materials. When the gate electrode is formed by using such semiconductor, an advantage that control over the threshold voltage is easy can be obtained. There can be obtained another advantage that setting the threshold voltage to a desired value is easy with respect to both the n-type semiconductor device and the p-type semiconductor device when forming a complementary semiconductor device. Additionally, when the gate electrode is formed of a metal or a compound containing a metal, the resistance of the gate electrode is suppressed, and hence a high-speed operation of the device can be obtained, which is preferable. Further, since a oxidative reaction hardly advances when the gate electrode is formed of a metal, there is also an advantage that controllability of an interface is excellent, e.g., an interfacial state on an interface of the gate electrode and the dielectric layer is suppressed.

Furthermore, although the gate electrode is formed by using a method of depositing a material of the gate electrode and then performing anisotropic etching in this embodiment, it may be formed by using a burying method such as damascene process. When the source/drain regions are formed prior to formation of the gate electrode, the source/drain regions and the gate electrode are formed in a self-aligning manner by using the damascene process, which is preferable.

Moreover, although both an upper side and a lower side of the gate electrode have the same length measured in a main direction of a current flowing through the component in this embodiment, this is not essential. For example, it is possible to adopt a shape like the letter "T" in which the upper side of the gate electrode has a longer measured length than the lower side of the same, for example. In this case, an advantage that the gate resistance can be reduced can be obtained.

Additionally, although a silicide or germanide process has not been described in this embodiment, a silicide or germanide layer may be formed on the source/drain regions. Further, a method of, e.g., depositing or growing a layer containing a metal on the source/drain regions may be used. When such a method is adopted, the resistance of the source/drain regions is reduced, which is preferable. When forming the gate electrode by using, e.g., polycrystal silicon, the gate electrode may be silicided or germanided. In this case, when the gate electrode is silicided or germanided, the gate resistance is reduced, which is preferable. Further, an elevated source/drain structure may be used. The elevated source/drain structure can also reduce the resistance of the source/drain regions, which is preferable.

Furthermore, the upper side of the gate electrode is exposed in this embodiment, and an insulator such as silicon oxide, silicon nitride, or silicon oxynitride may be provided on the upper side. In particular, when the gate electrode must be protected during the manufacturing process, e.g., when the gate electrode is formed of a material containing a metal and a silicide or germanide layer is formed on the source/drain regions, a protective material, e.g., silicon oxide, silicon nitride, or silicon oxynitride must be provided.

Moreover, although the hafnium oxide film is used as the gate dielectric layer in this embodiment, a dielectric layer such as a silicon oxide film or a silicon oxynitride film, or any other dielectric layer such as a lamination of these films may be used.

If nitrogen is present in the dielectric layer, an impurity is suppressed from being diffused in the substrate when polycrystal silicon containing an impurity is used for the gate electrode, and hence an advantage that a fluctuation in threshold voltage is suppressed is preferably obtained.

On the other hand, when a silicon oxide is used, since an interface state of the interface with respect to the gate electrode or a quantity of fixed charges in the dielectric layer is small, an advantage that a fluctuation in device characteristics can be suppressed is obtained. Additionally, for example, when an oxide of a given material is used as the dielectric layer, a method of, e.g., first forming a film of this material and then oxidizing this film may be adopted.

Further, exposure to oxygen gas in an excited state which does not necessarily involve an increase in temperature may be carried out. When the method of exposure to oxygen gas in the excited state which does not involve an increase in temperature is utilized to perform formation, it is possible to preferably suppress a change in concentration distribution of the impurity in the channel region due to diffusion.

Furthermore, when silicon oxynitride is used, a silicon oxide film may be first formed and then this film is exposed to a gas containing nitrogen in a temperature rising state or an excited state to introduce nitrogen into the dielectric layer. When the method of exposure to nitrogen gas in an excited state which does not involve an increase in temperature is utilized to perform formation, it is possible to preferably suppress a change in concentration distribution of the impurity in the channel region which is caused due to diffusion.

Alternatively, a silicon nitride film may be first formed, and this film may be exposed to a gas containing oxygen in a temperature rising state or an excited state to introduce the oxygen. When the method of exposure to oxygen gas in an excited state which does not involve an increase in temperature is utilized to perform formation, it is possible to preferably suppress a change in concentration distribution of the impurity in the channel region which is caused due to diffusion.

Moreover, it is possible to use, e.g., an oxide of a metal or the like such as Hf (hafnium), Zr (zirconium), Ti (titanium), Sc (scandium), Y (yttrium), Ta (tantalum), Al, La (lanthanum), Ce (cerium), Pr (praseodymium), or lanthanoid-based elements, a silicate material containing various elements including these elements, a high-dielectric constant film such as a dielectric layer containing nitrogen mixed in these materials, or any other dielectric layer such as a lamination of these materials.

Additionally, the dielectric layer forming method is not restricted to the CVD method, and a method such as a thermal oxidation method, or any other method such as a vacuum evaporation method, a sputtering method, or an epitaxial growth method can be used.

Further, although a gate sidewall has not been described in this embodiment, a sidewall may be provided to the gate electrode. In particular, when forming the gate dielectric layer by using a high-dielectric constant material, providing the gate sidewall formed of a high-dielectric constant material preferably enables alleviating an electric field in the gate dielectric layer near a lower end corner of the gate electrode, and hence an advantage that the reliability of the gate dielectric layer can be improved is obtained, as described in JP3658564.

Furthermore, although post-oxidation after forming the gate electrode has not been mentioned in this embodiment, the post-oxidation process may be carried out if it is possible in terms of, e.g., a material of the gate electrode. Moreover, the present invention is not restricted to the post-oxidation, and a method, e.g., a chemical treatment or exposure to a reactive gas may be utilized to perform the processing of rounding the corner of the gate electrode. When such a process can be effected, since an electric field at the lower end corner portion of the gate electrode can be alleviated by this process, the reliability of the gate dielectric layer can be preferably improved.

Additionally, although not clearly described in this embodiment, a silicon oxide film may be used for an interlayer dielectric layer, or a material other than a silicon oxide, e.g., a low-dielectric constant material may be utilized for the interlayer dielectric layer. Since a parasitic capacitance of the device is reduced when a dielectric constant of the interlayer dielectric layer is lowered, an advantage that a high-speed operation of the device can be obtained is provided.

Further, although there is no description about a contact hole, a self-aligned contact may be formed. Since an area of the device can be reduced when the self-aligned contact is used, the degree of integration can be preferably improved.

Furthermore, although not clearly described in this embodiment, the metal layer for wiring lines may be formed based on, e.g., a sputtering method or a deposition method. Moreover, a method such as metal selective growth may be used, or a method such as a damascene method can be adopted. As a material for the wiring metal, for example, Al (aluminum) containing silicon may be used, or a metal such as Cu (copper) may be utilized. In particular, Cu is preferable since it has a low resistivity.

Second Embodiment

Figure 6:
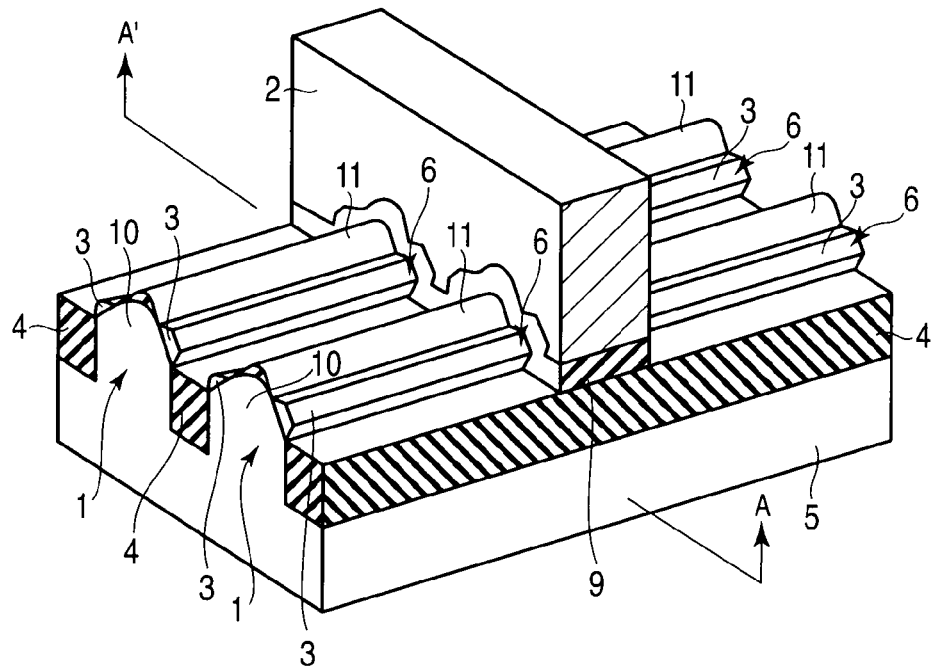
FIG. 6 is a perspective view for explaining a configuration of a semiconductor component according to a second embodiment.

FIG. 6 is a schematic perspective view of a semiconductor component according to a second embodiment. An interlayer dielectric layer, a wiring metal, etc. are omitted in the drawing. A semiconductor component according to this embodiment is formed on a silicon substrate 5 having a face (100) or a face orientation crystallographically equivalent to this face.

Each active area 1 partitioned by isolation regions 4 formed in the silicon substrate 5 has a protruding region 10 on a surface of the silicon substrate 5, a silicon oxide film 11 is formed on this region 10, and SiGe layers 6 are formed on side surfaces thereof. Note that reference numeral 6 of the SiGe layer denotes the SiGe layer on the front side of the protruding region 10 alone, and a layer having the same shape on a side behind the protruding region 10 is also the SiGe layer 6. The protruding region 10 has a face (113) or a face having a face orientation crystallographically equivalent to this face as a side surface. Further, source/drain regions 3 are formed in the SiGe layers 6.

It is to be noted that a bottom of each source/drain region 3 matches with an interface of the SiGe layer 6 and the protruding region 10 in FIG. 6, but the source/drain region 3 may be completely included in the SiGe layer 6, or it may be present to extend to not only the SiGe layer 6 but also the protruding region 10.

Furthermore, a main direction of a current flowing through the semiconductor component, i.e., a direction along which the source/drain regions 3 are connected is made to be a direction [110] or a direction crystallographically equivalent to this direction. Moreover, a gate electrode 2 is formed on the silicon oxide film 11 and the SiGe layer 6 through a gate dielectric layer 9.

That is, in the semiconductor component according to the second embodiment, since each source/drain region 3 is formed in the SiGe layer 6 having the face (113) or a face having a face orientation crystallographically equivalent to this face, a compressive strain is applied to the SiGe layer 6 in an in-plane direction, thereby obtaining a semiconductor component having a high electron mobility.

Figure 7:
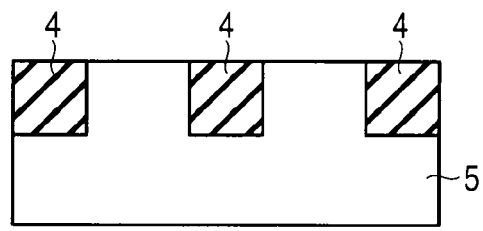

A manufacturing method of a semiconductor component according to this embodiment will now be described. Note that each of FIGS. 7 to 11 shows a cross section taken along a line A-A' in FIG. 6. First, as shown in FIG. 7, each isolation region 4 is formed by, e.g., a shallow trench method. At this time, the isolation region 4 is arranged in the direction [110] or a direction crystallographically equivalent to this direction.

Figure 8:
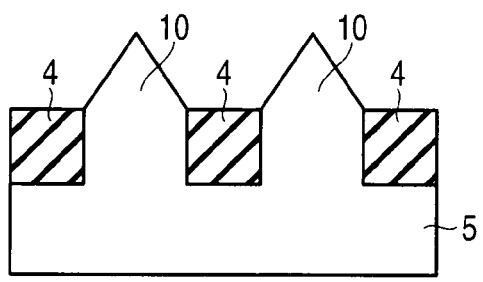

Then, as shown in FIG. 8, each protruding region 10 consisting of silicon is formed on the silicon substrate 5 by using, e.g., an SiH$_4$ gas and an HCl gas based on an epitaxial growth method. At this time, the face (113) and a face having a face orientation crystallographically equivalent to this face often appears on each side surface.

Subsequently, as shown in FIG. 9, each silicon oxide film 11 is formed on the surface of the protruding region 10 by, e.g., thermal oxidation. In general, since the silicon oxide film 11 is formed with a larger thickness on an edge than that on a flat region, the silicon oxide film 11 is thick near the edge alone present on the protruding region 10.

Then, as shown in FIG. 10, the silicon oxide film 11 formed on each side surface of the protruding region is removed by, e.g., a diluted hydrofluoric acid treatment. At this time, the silicon oxide film 11 near the edge of the protruding region also becomes thin, but the silicon oxide film is formed with a larger thickness near the edge as compared with that on the flat region, thereby leaving the silicon oxide film 11 near the edge alone.

Then, as shown in FIG. 11, the SiGe layer 6 having silicon and germanium composition ratios of 0.5 and 0.5, respectively, is formed on each side surface of each protruding region 10 by using, e.g., an SiH$_4$ gas, a GeH$_4$ gas, or an HCl gas based on, e.g., the epitaxial growth method. Subsequently, $1\times10^{12}/cm^2$ of B (boron) ions (not shown) are implanted into, e.g., the silicon substrate 5 or the SiGe layer 6 with an energy of, e.g., 5 keV. Thereafter, the same process as that depicted in FIG. 5 according to the first embodiment is performed.

In this embodiment, the semiconductor component is formed on the semiconductor substrate having the face (100) or a face orientation crystallographically equivalent to this face. When such configuration is adopted, the direction [110] or a direction crystallographically equivalent to this direction is present in two directions, which are parallel to the substrate surface and orthogonal to each other. Therefore, an advantage that a degree of freedom in arrangement of the semiconductor component in the semiconductor substrate is increased can be obtained.

On the other hand, when the SiGe layer is directly formed without providing each protruding region on the substrate surface as in the first embodiment, another advantage that the process is simplified can be obtained.

Further, in this embodiment, when the silicon oxide film is provided near the edge of each protruding region, the gate dielectric layer is a lamination layer of a silicon oxide and a hafnium oxide film near the edge. As a result, the gate dielectric layer is formed with a larger equivalent oxide thickness near the edge, i.e., between flat regions as compared with that in the flat region. Furthermore, the corner of the edge is rounded as compared with a shape immediately after forming each protruding region. Consequently, an electric field in the gate dielectric layer near the edge is alleviated, and an advantage that a breakdown voltage or the reliability of the gate dielectric layer is improved can be obtained.

Moreover, in this embodiment, the example where the two source/drain regions or the two channel regions are provided has been described, but this configuration is not essential, and the present invention can be likewise applied to a configuration where the number of the source/drain regions or the channel regions is 1 or 3 or more. When a plurality of source/drain regions or channel regions are present as described in this embodiment, this configuration is equivalent to providing a plurality of semiconductor components in parallel, and hence an advantage that high current drivability can be obtained is provided.

Additionally, each side surface of the protruding region is the face (113) or a face having a face orientation crystallographically equivalent to this face in this embodiment. Even if the side surface is a face having any other face orientation, the same effect can be obtained when this face is a face represented as a face (11N) by using N that satisfies 1.2<N<10 or a face having a face orientation crystallographically equivalent to this face. When the side surface is the face (113) or a face having a face orientation crystallographically equivalent to this face like this embodiment, an advantage that the conventionally known epitaxial growth technology can be used is provided.

In this embodiment, such various modifications as described in the first embodiment can be carried out, and the same effect can be obtained.

Third Embodiment

Figure 12:
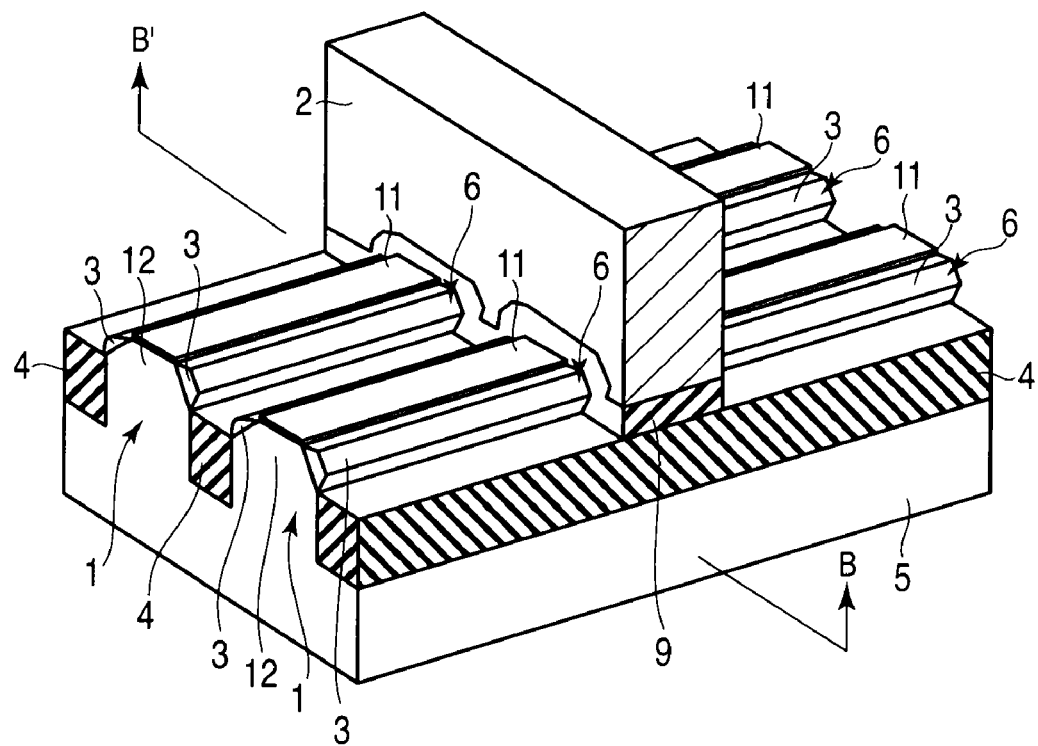
FIG. 12 is a perspective view for explaining a configuration of a semiconductor component according to a third embodiment.

FIG. 12 is a schematic perspective view of a semiconductor component according to a third embodiment. An interlayer dielectric layer, a wiring metal, etc. are omitted in the drawing. The semiconductor component according to this embodiment is formed on a silicon substrate 5 having a face (100) or a face having a face orientation crystallographically equivalent to this face. An active area 1 partitioned by each isolation region 4 formed in the silicon substrate 5 has a trapezoidal region 12 on a surface of the silicon substrate 5, a silicon oxide film 11 is formed thereon, and each SiGe layer 6 is formed on each side surface of the trapezoidal region 12. Note that a lead line indicating the SiGe layer 6 is shown with respect to the SiGe layer 6 on a front side of the trapezoidal region 12 alone, but a layer having the same shape on a side behind the trapezoidal region 12 is also the SiGe layer 6.

The trapezoidal region 12 has a face (113) or a face having a face orientation crystallographically equivalent to this face as its side surface. Further, source/drain regions 3 are formed in each SiGe layer 6. Note that a bottom of each source/drain region 3 matches with an interface of the SiGe layer 6 and the trapezoidal region 12 formed on the surface of the silicon substrate 5 in FIG. 12, but each source/drain region 3 may be completely included in the SiGe layer 6, or it may be present to extend to not only the SiGe layer 6 but also the trapezoidal region 12 formed on the surface of the silicon substrate 5.

Furthermore, a main direction of a current flowing through the semiconductor component, i.e., a direction along which the source/drain regions 3 are connected is made to be a direction [110] or a direction crystallographically equivalent to this direction. Moreover, a gate electrode 2 is formed on the silicon oxide film 11 and the SiGe layer 6 through a gate dielectric layer 9.

A manufacturing method of a semiconductor component according to this embodiment will now be described hereinafter. It is to be noted that each of FIGS. 13 to 16 shows a cross section taken along a line B-B' in FIG. 12.

Figure 13:
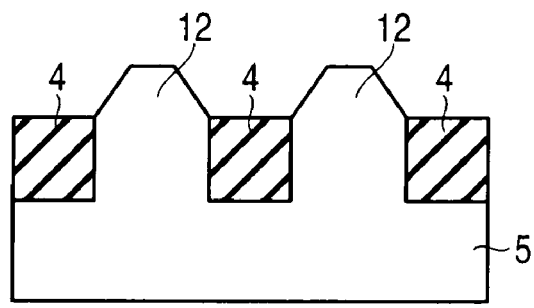

First, after the process depicted in FIG. 7 according to the second embodiment, each trapezoidal region 12 consisting of silicon is formed on the silicon substrate 5 by using, e.g., an $SiH_4$ gas and an HCl gas based on, e.g., the epitaxial growth method as shown in FIG. 13. At this time, the face (113) or a face having a face orientation crystallographically equivalent to this face often appears as each side surface. It is to be noted that a height can be adjusted by adjusting a time for performing the epitaxial growth.

Then, as shown in FIG. 14, for example, a silicon nitride film 13 is formed by, e.g., a CVD method. Thereafter, the surface is flattened by, e.g., a chemical mechanical polishing (CMP) method to expose an upper surface of the trapezoidal region 12.

Then, as shown in FIG. 15, a silicon oxide film 11 is formed on the upper surface of the trapezoidal region 12 by, e.g., thermal oxidation. At this time, although the silicon oxide film 11 is formed on the exposed upper surface of the trapezoidal region 12, the silicon oxide film 11 is not formed on each side surface of the trapezoidal region 12 covered with the silicon nitride film 13.

Then, as shown in FIG. 16, the silicon nitride film 13 is removed by, e.g., a hot phosphoric acid treatment. Thereafter, the same process as that shown in FIG. 11 and thereafter in the second embodiment is carried out.

In this embodiment, since the dielectric layer 11 on the upper surface of the trapezoid is formed into a flat surface shape differing from the second embodiment, controlling the shape of the dielectric layer 11 is easy. On the other hand, when the configuration described in the second embodiment is adopted, another advantage that the process is simplified can be obtained.

Further, in this embodiment, the side surface of the trapezoidal region is the face (113) or a face having a face orientation crystallographically equivalent to this face. Even if the side surface is a face having any other face orientation, the same effect can be obtained as long as the side surface is a face represented as a face (11N) by using N that satisfies 1.2<N<10 or a face having a face orientation crystallographically equivalent to this face. When the side surface is the face (113) or a face having a face orientation crystallographically equivalent to this face as described in this embodiment, an advantage that the conventionally known epitaxial growth technology can be used is provided.

In this embodiment, various modifications as those described in the foregoing embodiments can be carried out, thereby obtaining the same effect.

Fourth Embodiment

Figure 17:
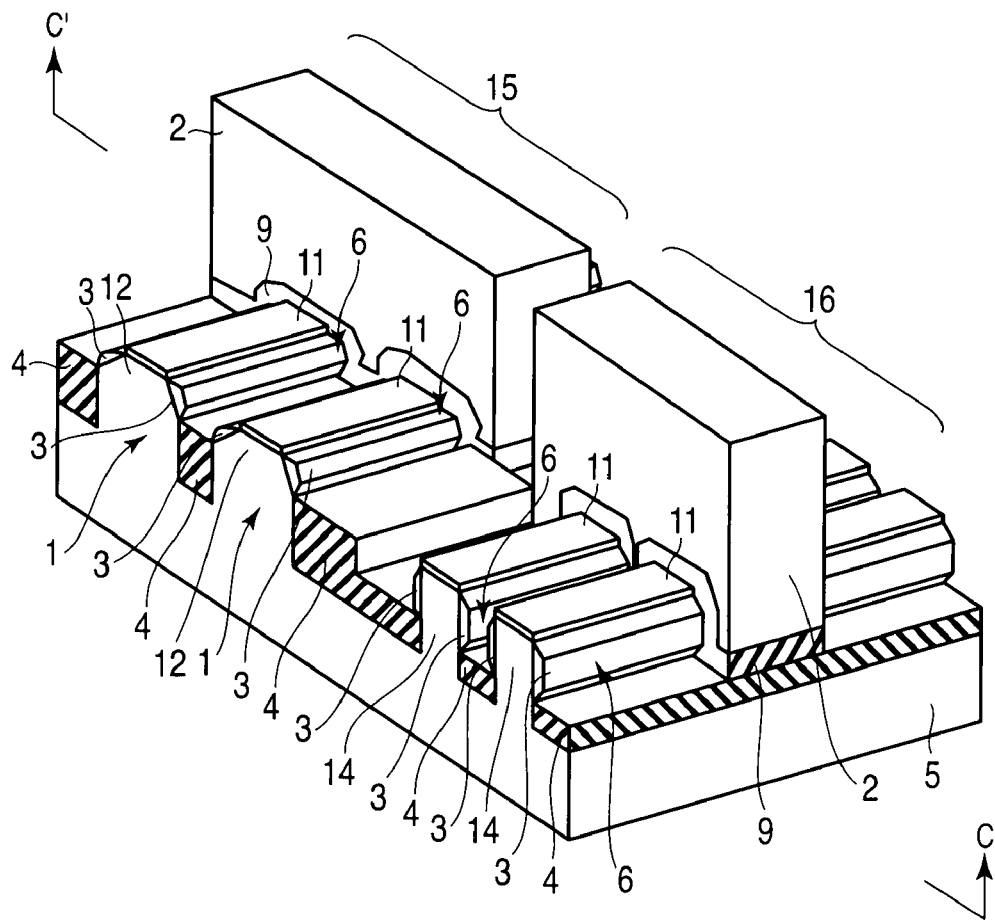
FIG. 17 is a perspective view for explaining a configuration of a semiconductor device according to a fourth embodiment.

FIG. 17 is a perspective view of a semiconductor device according to a fourth embodiment. Further, an interlayer dielectric layer, a wiring metal, etc. are omitted in the drawing. The semiconductor device according to this embodiment is formed on a silicon substrate 5 having a face (100) or a face orientation crystallographically equivalent to this face, and includes an n-type semiconductor component 15 and a p-type semiconductor component 16.

In the n-type semiconductor component 15, an active area 1 partitioned by each isolation region 4 formed in the silicon substrate 5 has a trapezoidal region 12 on a surface of the silicon substrate 5, a silicon oxide film 11 is formed on the trapezoidal region 12, and an SiGe layer 6 is formed on each side surface of this region 12. It is to be noted that a lead line indicating the SiGe layer 6 is shown with respect to the SiGe layer 6 on a front side of the trapezoidal region 12 alone, but a layer having the same shape on a side behind the trapezoidal region 12 is also the SiGe layer 6. The trapezoidal region 12 has a face (113) and a face having a face orientation crystallographically equivalent to this face. Furthermore, source/drain regions 3 are formed in the SiGe layer 6.

It is to be noted that a bottom of each source/drain region 3 matches with an interface of the SiGe layer 6 and the trapezoidal region 12 in FIG. 17, but each source/drain region 3 may be completely included in the SiGe layer 6 and it may be present to extend to not only the SiGe layer 6 but also the trapezoidal region 12 formed on the surface of the silicon substrate 5.

Furthermore, a main direction of a current flowing through the semiconductor component, i.e., a direction along which the source/drain regions 3 are connected is made to be a direction [110] or a direction crystallographically equivalent to this direction. Moreover, a gate electrode 2 is formed on the silicon oxide film 11 and the SiGe layer 6 through a gate dielectric layer 9.

Moreover, in the p-type semiconductor component 16, the active area 1 partitioned by each isolation region 4 formed in the silicon substrate 5 has each rectangular parallelepiped region 14 on the surface of the silicon substrate 5, the silicon oxide film 11 is formed on this region 14, and the SiGe layer 6 is formed on each side surface of this region 14.

Note that a lead line indicating the SiGe layer 6 is shown with respect to the SiGe layer 6 on the front side of the rectangular parallelepiped region 14 alone, but a layer having the same shape on a side behind the rectangular parallelepiped region 14 is also the SiGe layer 6. The rectangular parallelepiped region 14 has a face (110) and a face having a face orientation crystallographically equivalent to this face as a side surface thereof. Additionally, the source/drain regions 3 are formed in the SiGe layer 6.

It is to be noted that the bottom of each source/drain region 3 matches with an interface of the SiGe layer 6 and the rectangular parallelepiped region 14 in FIG. 17, but each source/drain region 3 may be completely included in the SiGe layer 6 and it may be present to extend to not only the SiGe layer 6 but also the rectangular parallelepiped region 14 formed on the surface of the silicon substrate 5.

Further, a main direction of a current flowing through the semiconductor component, i.e., a direction along which the source/drain regions 3 are connected is made to be a direction [110] or a direction crystallographically equivalent to this direction. Furthermore, the gate electrode 2 is formed on the silicon oxide film 11 and the SiGe layer 6 through the gate dielectric layer 9.

It is to be noted that the trapezoidal region 12, the rectangular parallelepiped region 14, the SiGe layer 6, the source/drain region 3, or the silicon oxide film 11 is present on both the side behind the gate electrode 2 and the front side in each of the n-type semiconductor component 15 and the p-type semiconductor component 16, but a hidden portion is not shown in FIG. 17. Moreover, each lead line denoting a name is omitted on the side behind the gate electrode 2.

Figure 18:
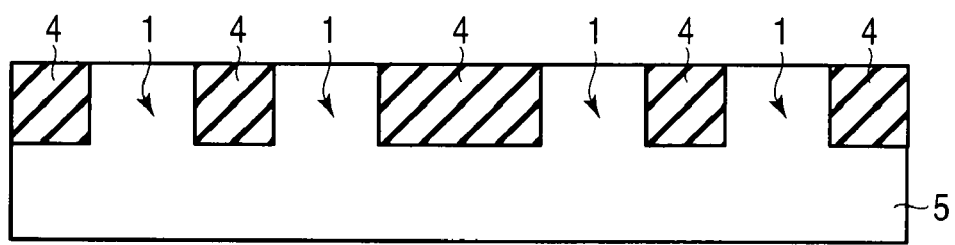
FIGS. 18 to 27 are cross-sectional views for explaining a manufacturing process of a semiconductor component according to the fourth embodiment in stages.

A manufacturing method of a semiconductor component according to this embodiment will now be described hereinafter. It is to be noted that each of FIGS. 18 to 27 shows a cross section taken along a line C-C' in FIG. 17. First, as shown in FIG. 18, each isolation region 4 is formed based on a method such as a shallow trench method. At this time, the isolation region 4 is arranged in the direction [110] or a direction crystallographically equivalent to this direction.

Figure 19:
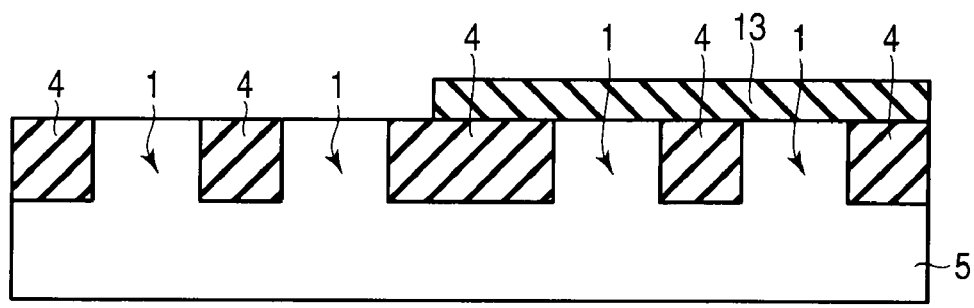

Then, as shown in FIG. 19, for example, a silicon nitride film 13 is formed based on a method such as a CVD method. Thereafter, the silicon nitride film 13 on the n-type semiconductor component forming region is removed. The silicon nitride film 13 can be partially kept and partially removed based on a method such as photoengraving.

Figure 20:
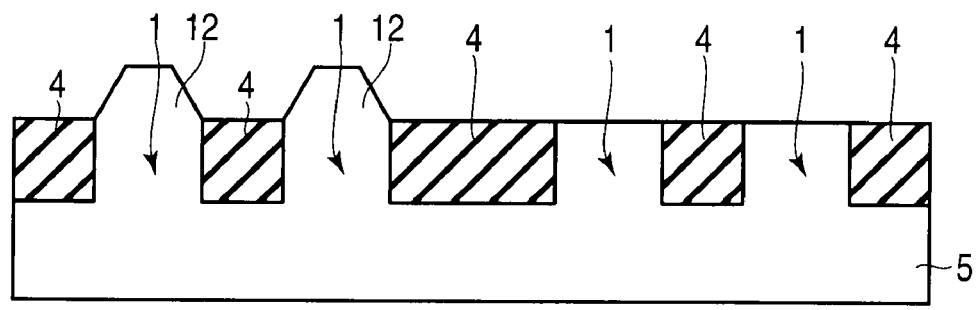

Subsequently, as shown in FIG. 20, each trapezoidal region 12 consisting of silicon is formed on the silicon substrate 5 by using, e.g., an $SiH_4$ gas and an HCl gas based on, e.g., an epitaxial growth method. At this time, the face (113) or a face having a face orientation crystallographically equivalent to this face often appears as the side surface. It is to be noted that a height can be adjusted by adjusting a time for performing the epitaxial growth. Subsequently, a method such as a hot phosphoric acid treatment is used to remove the silicon nitride film 13.

Figure 21:
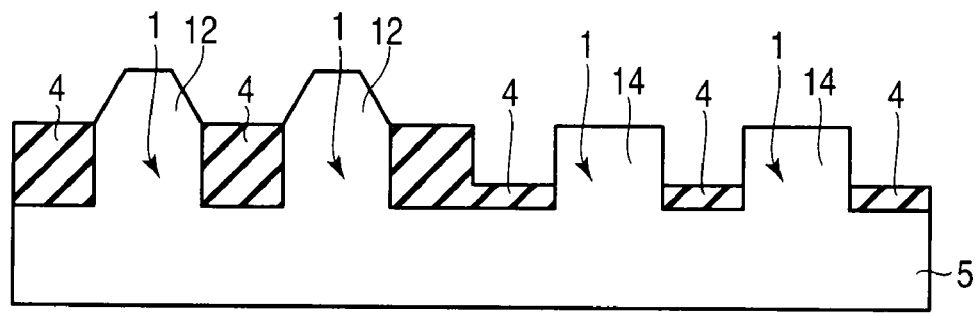

Then, as shown in FIG. 21, for example, a method such as an RIE method is used to partially remove each isolation region 4 on the p-type semiconductor component forming region. When this process is carried out, the p-type semiconductor active area becomes the rectangular parallelepiped region 14. At this time, since each isolation region 4 is arranged in the direction [110] or a direction crystallographically equivalent to this direction, the face (110) or a face having a face orientation crystallographically equivalent to this face appears as the side surface of the rectangular parallelepiped region.

Figure 22:
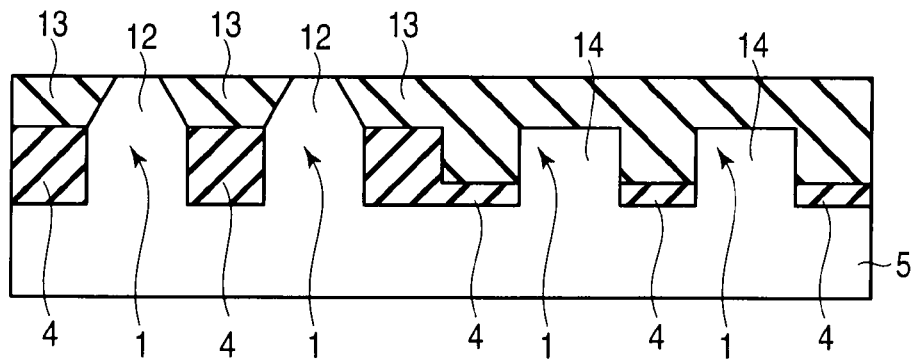

Subsequently, as shown in FIG. 22, for example, the silicon nitride film 13 is formed by, e.g., the CVD method. Thereafter, the method such as a CMP method is adopted to flatten the surface, thereby exposing the upper surface of each trapezoidal region 12.

Figure 23:
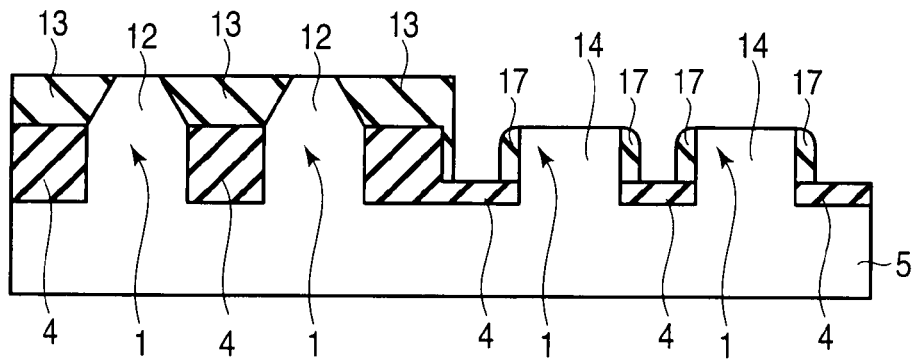

Then, as shown in FIG. 23, the silicon nitride film 13 on the p-type semiconductor component forming region is subjected to anisotropic etching by, e.g., an RIE method to expose the upper surface of each rectangular parallelepiped region 14 and to form a silicon nitride sidewall 17 on each side surface of the rectangular parallelepiped region.

Figure 24:
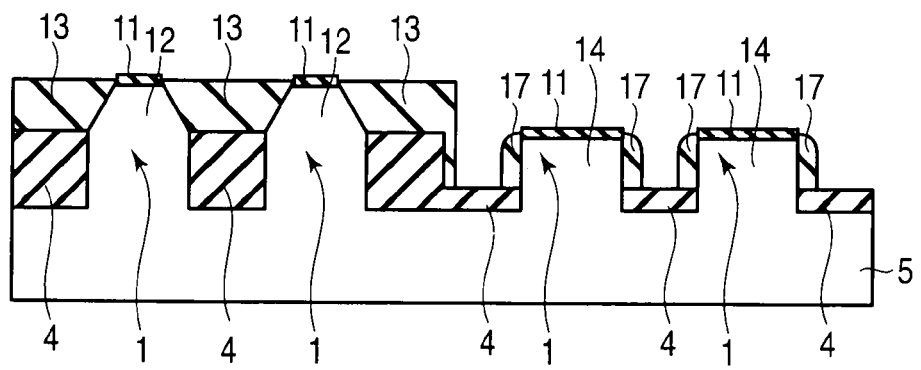

Subsequently, as shown in FIG. 24, the silicon oxide film 11 is formed on the upper surface of each trapezoidal region 12 and the upper surface of each rectangular parallelepiped region 14 by using a method such as thermal oxidation. At this time, the silicon oxide film 11 is formed on the exposed upper surface of the trapezoidal region 12 and the upper surface of the rectangular parallelepiped region 14, but the silicon oxide film 11 is not formed on each side surface of the trapezoidal region 12 covered with the silicon nitride film 13 and each side surface of the rectangular parallelepiped region 14 covered with the silicon nitride sidewall 17.

Figure 25:
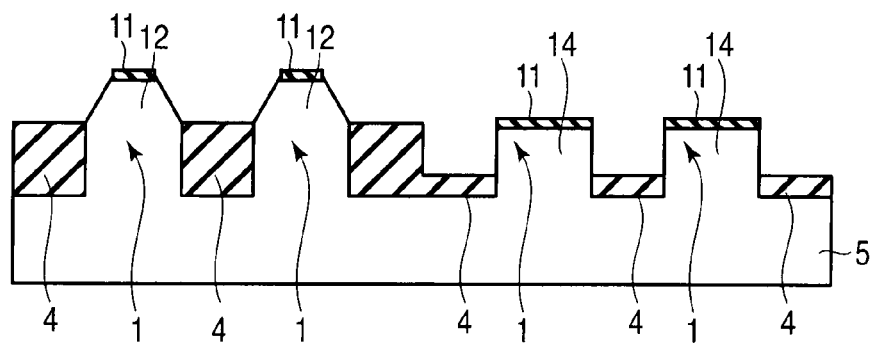

Then, as shown in FIG. 25, the silicon nitride film 13 or the silicon nitride sidewall 17 is removed by, e.g., hot phosphoric acid treatment.

Figure 26:
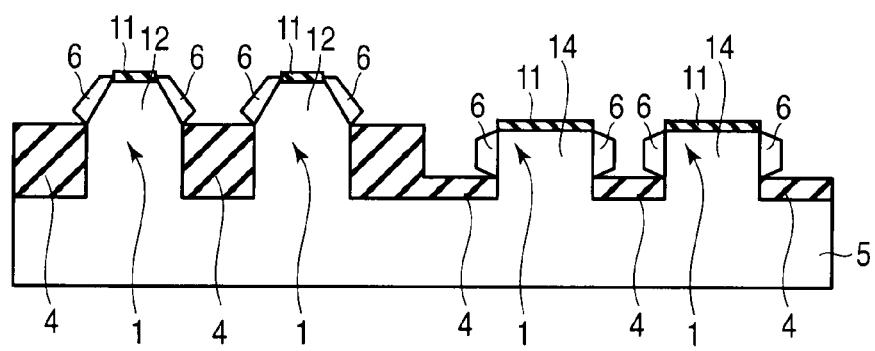

Subsequently, as shown in FIG. 26, the SiGe layer 6 having silicon and germanium composition ratios of 0.5 and 0.5, respectively, is formed on each side surface of the trapezoidal region 12 and each side surface of the rectangular parallelepiped region 14 by using, e.g., an SiH4 gas, a GeH4 gas, and an HCl gas based on the epitaxial growth method or the like.

Then, for example, $1\times10^{12}$ $cm^{-2}$ of B ions (not shown) are implanted into the silicon substrate 5 and the SiGe layer 6 in the n-type semiconductor component forming region with an energy of, e.g., 5 keV. Subsequently, for example, $1\times10^{12}$ $cm^{-2}$ of P ions (not shown) are implanted into the silicon substrate 5 and the SiGe layer 6 in the p-type semiconductor component forming region with an energy of, e.g., 10 keV.

Figure 27:
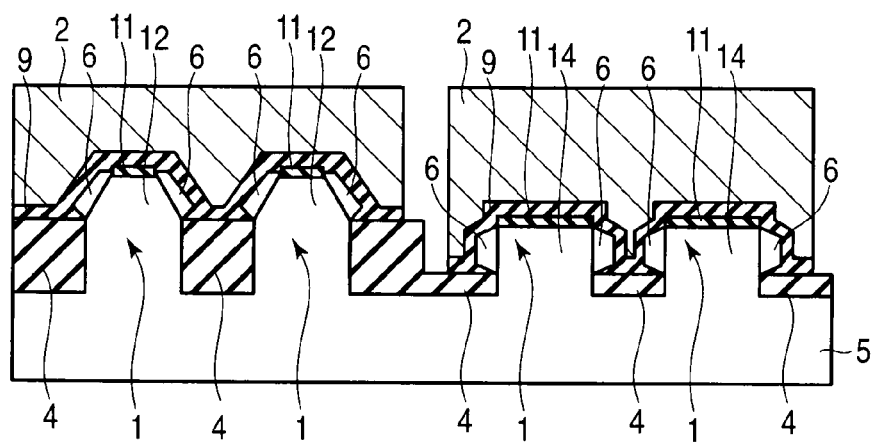

Then, as shown in FIG. 27, for example, a hafnium oxide film (not shown) having a thickness of, e.g., 5 nm is formed on the entire surface of the isolation region 4 or the SiGe layer 6 by, e.g., the CVD method. Subsequently, for example, a W film (not shown) having a thickness of, e.g., 10 nm is formed on the entire surface of the hafnium oxide film (not shown) by, e.g., the CVD method. Then, anisotropic etching, e.g., the RIE method is carried out to process the W film and the hafnium oxide film, thereby forming the gate electrode 2 and the gate dielectric layer 9.

Thereafter, for example, $1\times10^{15}$ $cm^{-2}$ of As ions are implanted into the n-type semiconductor component forming region with an energy of, e.g., 10 keV to form each source/drain region 3 of the n-type semiconductor component.

Subsequently, for example, $1\times10^{15}$ $cm^{-2}$ of B ions are implanted into the p-type semiconductor component forming region with an energy of, e.g., 5 keV to form each source/drain region 3 of the p-type semiconductor component. Thereafter, like the conventional technology, the semiconductor device according to the present embodiment depicted in FIG. 17 is formed through an interlayer dielectric layer forming process, a wiring process, and other processes.

When the semiconductor device is formed as in this embodiment, the n-type semiconductor component is formed on the face (311) or a face having a face orientation crystallographically equivalent to this face to which compressive strain is applied along the in-plane direction, and the p-type semiconductor component is formed on the face (110) or a face having a face orientation crystallographically equivalent to this face to which the compressive strain is applied. Therefore, both the electron mobility within the n-type semiconductor component and hole mobility within the p-type semiconductor component have high values, thereby realizing a high-performance complementary semiconductor device that can perform a high-speed operation.

Further, when the semiconductor device is formed on the face (100) or a semiconductor substrate having a face orientation crystallographically equivalent to this face like this embodiment, the direction [110] or a direction crystallographically equivalent to this direction is present in two directions, which are parallel to the semiconductor substrate and orthogonal to each other. Therefore, the channels can be arranged in the two directions orthogonal to each other while maintaining the high mobility in both the n-type semiconductor component and the p-type semiconductor component, thereby obtaining an advantage that a degree of freedom in component arrangement is increased.

Therefore, the channel of the n-type semiconductor component and the channel of the p-type semiconductor component are arranged to be parallel in this embodiment, but this configuration is not essential, and they can be arranged to be orthogonal to each other. When forming a semiconductor device including a plurality of n-type semiconductor components, channels of the n-type semiconductor components different from each other can be arranged in directions orthogonal to each other. When forming a semiconductor device including a plurality of p-type semiconductor components, channels of the p-type semiconductor components different from each other can be arranged in directions orthogonal to each other.

It is to be noted that the n-type semiconductor component is formed by using the same method as that described in the third embodiment, but it may be formed by using the same method as that described in the second embodiment. When the n-type semiconductor component is formed by using the same method as that described in the second embodiment, the process for flattening the silicon nitride film is no longer necessary, and hence an advantage that the processes are simplified can be obtained. On the other hand, when the n-type semiconductor component is formed by using the same method as that described in the third embodiment like this embodiment, an advantage that control over the shape of the dielectric layer 11 in the n-type semiconductor component is facilitated can be obtained.

This embodiment can be modified in many ways like the foregoing embodiments, and the same effect can be obtained.

Fifth Embodiment

FIG. 28 is a schematic perspective view of a semiconductor device according to a fifth embodiment. An interlayer dielectric layer, a wiring metal, etc. are omitted, and they are not shown in the drawing. The semiconductor device according to this embodiment is formed on a face (110) or a silicon substrate 5 having a face orientation crystallographically equivalent to this face, and includes an n-type semiconductor component 15 and a p-type semiconductor component 16. The n-type semiconductor component 15 or the p-type semiconductor component 16 has a rectangular parallelepiped region 14 in an active area 1 partitioned by each isolation region 4 formed in the silicon substrate 5, and an SiGe layer 6 is formed on each side surface thereof. The rectangular parallelepiped region 14 has a face (113) or a face having a face orientation crystallographically equivalent to this face in the n-type region and has the face (110) or a face having a face orientation crystallographically equivalent to this face in the p-type semiconductor component as a side surface which is the wider of the two types of side surfaces.

It is to be noted that a lead line indicating the SiGe layer 6 is shown with respect to the SiGe layer 6 on a front side of the rectangular parallelepiped region 14 alone, but a layer having the same shape on a side behind the rectangular parallelepiped region 14 or the side surface is also the SiGe layer 6. Moreover, each source/drain region 3 is formed in the SiGe layer 6.

Note that a bottom of each source/drain region 3 matches with an interface of the SiGe layer 6 and the rectangular parallelepiped region in FIG. 28, the source/drain region 3 may be completely included in the SiGe layer 6 and it may be present to extend to not only the SiGe layer 6 but also the rectangular parallelepiped region 14 formed on the surface of the silicon substrate 5.

Further, a main direction of a current flowing through the semiconductor component, i.e., a direction along which the source/drain regions 3 are connected is made to be vertical to the substrate surface, namely, made to become a direction [110] or a direction crystallographically equivalent to this direction. Therefore, the source/drain regions are present at three positions in the n-type semiconductor component 15 or the p-type semiconductor component 16. Of these regions, one of the source and the drain is provided above the gate electrode 2 and the other of the source and the drain is provided at each of the two positions below the gate electrode 2 in FIG. 28. That is, the other electrode of the source and the drain is divided and provided at the two positions. Furthermore, the gate electrode 2 is formed on the SiGe layer 6 through a gate dielectric layer 9.

It is to be noted that, in both the n-type semiconductor component 15 and the p-type semiconductor component 16, the rectangular parallelepiped region 14, the SiGe layer 6, or the source/drain region 3 is present on both a side behind the rectangular parallelepiped region 14 and the front side, but a portion behind the gate electrode 2 is not shown in FIG. 30. Moreover, lead lines and reference numerals are omitted on the side behind the rectangular parallelepiped region 14.

A manufacturing method of a semiconductor device according to this embodiment will now be described. Note that each of FIGS. 29 to 32 shows a cross section taken along a line D-D' of the n-type semiconductor component in FIG. 28. A cross section taken along a line E-E' of the p-type semiconductor component in FIG. 28 is essentially the same except that a conductivity type of an impurity is reversed and a face orientation shown is different.

First, as shown in FIG. 29, for example, each isolation region 4 is formed by, e.g., a shallow trench method. At this time, the isolation region 4 is arranged in a direction [332] or a direction crystallographically equivalent to this direction. That is, a direction that is parallel to the substrate surface and also parallel to a page space is a direction [113] or a direction crystallographically equivalent to this direction. In the case of the p-type semiconductor component, the isolation region 4 is arranged in a direction [100] or a direction crystallographically equivalent to this direction. Therefore, in the case of the p-type semiconductor component, the direction which is parallel to the substrate surface and parallel to the page space is a direction [110] or a direction crystallographically equivalent to this direction.

Then, as shown in FIG. 30, anisotropic etching, e.g., RIE is carried out with respect to the active area 1 to process each rectangular parallelepiped region 14. At this time, a side surface which is vertical to the page space in the side surfaces of the rectangular parallelepiped region is a face (113) or a face having a face orientation crystallographically equivalent to this face. In the case of the p-type semiconductor component, a side surface vertical to the page space in the side surfaces of the rectangular parallelepiped region is a face (110) or a face having a face orientation crystallographically equivalent to this face. Subsequently, each isolation region 4 is partially removed and thereby processed to have substantially the same height as the surface of the active area 1.

Then, as shown in FIG. 31, the SiGe layer 6 having silicon and germanium composition ratios of 0.5 and 0.5, respectively, is formed on the surface of the active area 1 or each side surface or an upper surface of the rectangular parallelepiped region 14 by using, e.g., an $SiH_4$ gas, a $GeH_4$ gas, and an HCl gas based on the epitaxial growth method or the like. It is to be noted that the SiGe layer 6 formed on the upper surface of the rectangular parallelepiped region 14 is omitted in FIG. 28.

Subsequently, for example, $1\times10^{12}$ cm$^{-2}$ of, e.g., B ions (not shown) are implanted into the silicon substrate 5, the rectangular parallelepiped region 14, and the SiGe layer 6 in the n-type semiconductor component forming region with an energy of, e.g., 5 keV. Then, $1\times10^{12}$ cm$^{-2}$ of, e.g., P ions (not shown) are implanted into the silicon substrate 5, the rectangular parallelepiped region 14, and the SiGe layer 6 in the p-type semiconductor component forming region with an energy of, e.g., 10 keV.

Subsequently, as shown in FIG. 32, a hafnium oxide film (not shown) having a thickness of, e.g., 5 nm is formed on the entire surface of each isolation region 4 or each SiGe layer 6 by, e.g., a CVD method. Then, for example, a W film (not shown) having a thickness of 10 nm is formed on the entire surface of the hafnium oxide film (not shown) by, e.g., the CVD method. Subsequently, anisotropic etching such as RIE is carried out to process the W film and the hafnium oxide film, thereby forming the gate electrode 2 and the gate dielectric layer 9.

Then, for example, $1\times10^{15}$ cm$^{-2}$ of As ions are implanted into the n-type semiconductor component forming region with an energy of, e.g., 10 keV to form each source/drain region 3 of the n-type semiconductor component. Subsequently, for example, $1\times10^{15}$ cm$^{-2}$ of B ions are implanted into the p-type semiconductor component forming region with an energy of, e.g., 5 keV to form each source/drain region 3 of the p-type semiconductor component. Thereafter, like the conventional art, the semiconductor device according to the present embodiment shown in FIG. 28 is formed through an interlayer dielectric layer forming process and a wiring process, etc.

When the semiconductor device is formed as in this embodiment, the n-type semiconductor component is formed on the face (311) or a face having a face orientation crystallographically equivalent to the former face to which the compressive strain is applied along the in-plane direction, and the p-type semiconductor component is formed on the face (110) or a face having a face orientation crystallographically equivalent to this face to which the compressive strain is applied in the in-plane direction. Therefore, both the electron mobility within the n-type semiconductor component and the hole mobility within the p-type semiconductor component have high values, thereby realizing a high-performance complementary semiconductor device which can perform an operation at a high speed.

Note that the n-type semiconductor component is formed on the face (311) or a face having a face orientation which is crystallographically equivalent to this face in this embodiment, but the present invention is not restricted to this face orientation. Generally, the same effect can be obtained even if the n-type semiconductor component is formed on a face which is represented as a face (11N) by using N satisfying 1.2<N<10 or a face having a face orientation crystallographically equivalent to this face.

Further, since a channel direction is made to be vertical to the substrate surface in this embodiment, the arrangement of the channel direction does not have to be considered when deciding the arrangement of the semiconductor component in the semiconductor device, and an advantage that design is simplified can be obtained. Furthermore, when the semiconductor device is formed based on the method according to this embodiment, there can be obtained another advantage that performing an epitaxial process only once can suffice. On the other hand, when the semiconductor device is formed on the face (100) or the semiconductor substrate having a face orientation crystallographically equivalent to this face as described in the fourth embodiment, the semiconductor device can be formed through substantially the same processes as those of formation of a conventional planar semiconductor device, and a further advantage that a manufacturing process is simplified can be obtained.

This embodiment can be modified in many ways as described in the foregoing embodiments, and the same effect can be obtained.

Sixth Embodiment

FIG. 33 is a schematic cross-sectional view of a semiconductor device according to a sixth embodiment. An interlayer dielectric layer, a wiring metal, etc. are omitted in the drawing. A support semiconductor substrate 18 consisting of silicon has a face (110) or a crystallographically equivalent face orientation. A semiconductor layer 20 consisting of silicon which has, e.g., a face (311) or a face orientation crystallographically equivalent to this face is selectively formed on an upper surface of this semiconductor substrate 18 through a buried dielectric layer 19, and this portion is an SOI substrate 21. This semiconductor layer 20 is surrounded by an isolation region 4 to form a well, and an n-type semiconductor component 15 is formed on an upper surface of this well. A semiconductor region 1 surrounded by the isolation region 4 is formed on the semiconductor substrate 18 adjacent to the n-type semiconductor component 15 through the isolation region 4, and a p-type semiconductor component 16 is formed on this semiconductor region 1.

Here, the n-type semiconductor component 15 is formed on an SiGe layer 6 formed on the semiconductor layer 20, and the p-type semiconductor component is formed on the SiGe layer 6 formed on the semiconductor region 1. Additionally, each source/drain region 3 is formed in the SiGe layer 6. Here, each of the semiconductor substrate 18 and the semiconductor layer 20 includes a direction [110] or a crystallographically equivalent direction in a surface thereof, and a direction along which the respective source/drain regions in each of the n-type semiconductor component and the p-type semiconductor component are connected, i.e., a main direction of a current flowing through a channel region is arranged to become the direction [110] or a crystallographically equivalent direction.

It is to be noted that a bottom portion of each source/drain region 3 matches with a bottom portion of each SiGe layer in FIG. 33, but the source/drain region 3 may be completely included in the SiGe layer 6 or it may be present to extend to not only the SiGe layer 6 but also the semiconductor substrate 18 or the semiconductor layer 20. Further, a gate electrode 2 is formed on the SiGe layer 6 through a gate dielectric layer 9.

A manufacturing method of a semiconductor device according to this embodiment will now be described hereinafter. First, as shown in FIG. 34, the SOI substrate 21 having the silicon semiconductor layer 20 formed on the silicon support substrate 18 through the buried insulator 19 is prepared. In this SOI substrate 21, an isolation region 4 is formed by, e.g., a shallow trench method. At this time, the isolation region 4 is arranged in such a manner that a channel is arranged in parallel to the direction [110] or a crystallographically equivalent direction in the surface of each of the silicon substrate 18 and the semiconductor layer 20 on the dielectric layer. In this manner, the active area 1 is formed of the silicon semiconductor layer 20.

Then, as shown in FIG. 35, the semiconductor layer 20 on the dielectric layer and the buried dielectric layer 19 in the p-type semiconductor component forming region are removed by, e.g., an RIE method, thereby exposing the surface of the silicon support substrate 18. To remove the semiconductor layer 20 on the dielectric layer, isotropic etching, e.g., wet processing may be used, but it is preferable to adopt anisotropic etching, e.g., the RIE method to remove the buried dielectric layer in order to avoid corrosion of the isolation region 4.

Subsequently, as shown in FIG. 36, for example, a silicon layer is formed on the support substrate 18 by using, e.g., an SiH$_4$ gas and an HCl gas based on the epitaxial growth method and the like. At this time, the surface of the active area 1 in the p-type semiconductor component does not have to have the same height as that of the surface of the isolation region 4. However, when both the members have the same height, there can be obtained an advantage that a focal depth required in a subsequent lithography process may be shallow.

Then, as shown in FIG. 37, the SiGe layer 6 having silicon and germanium composition ratios of, e.g., 0.5 and 0.5, respectively, is formed on the surface of the active area 1 of the n-type semiconductor component and the surface of the active area 1 of the p-type semiconductor component by using, e.g., an SiH$_4$ gas, a GeH$_4$ gas, and an HCl gas based on the epitaxial growth method and the like. Thereafter, for example, $1\times10^{12}$ cm$^{-2}$ of B ions (not shown) are implanted into the semiconductor layer 20 and the SiGe layer 6 in the n-type semiconductor component forming region with an energy of, e.g., 5 keV. Subsequently, for example, $1\times10^{12}$ cm$^{-2}$ of P ions (not shown) are implanted into the semiconductor layer 1 and the SiGe layer 6 in the p-type semiconductor component forming region with an energy of, e.g., 10 keV.

Then, as shown in FIG. 38, for example, a hafnium oxide film (not shown) having a thickness of, e.g., 5 nm is formed on the entire surface of the isolation region 4 or the SiGe layer 6 by, e.g., the CVD method. Subsequently, for example, a W film (not shown) having a thickness of, e.g., 10 nm is formed on the entire surface of the hafnium oxide film (not shown) by, e.g., the CVD method. Then, anisotropic etching, e.g., the RIE method is carried out to process the W film and the hafnium oxide film, thereby forming the gate electrode 2 and the gate dielectric layer 9.

Subsequently, for example, $1\times10^{15}$ cm$^{-2}$ of As ions are implanted into the n-type semiconductor component forming region with an energy of, e.g., 10 keV to form each source/drain region 3 of the n-type semiconductor component. Then, for example, $1\times10^{15}$ cm$^{-2}$ of B ions are implanted into the p-type semiconductor component forming region with an energy of, e.g., 5 keV to form each source/drain region 3 of the p-type semiconductor component.

Thereafter, like the conventional technology, the semiconductor device according to the present embodiment shown in FIG. 33 is formed through an interlayer dielectric layer forming process, a wiring process, and other processes.

When the semiconductor device is formed as in this embodiment, the n-type semiconductor component is formed on the face (311) or a face having a face orientation crystallographically equivalent to this face to which the compressive strain is applied along the in-plane direction, and the p-type semiconductor component is formed on the face (110) or a face having a face orientation crystallographically equivalent to this face to which the compressive strain is applied in the in-plane direction. Therefore, both the electron mobility within the n-type semiconductor component and the hole mobility within the p-type semiconductor component have high values, thereby realizing a high-performance complementary semiconductor device which can operate at a high speed.

It is to be noted that the support semiconductor substrate 18 is a semiconductor which has the face (110) or a face orientation crystallographically equivalent to this face, and the semiconductor layer 20 on the dielectric layer is a semiconductor having the face (311) or a face orientation crystallographically equivalent to this face in this embodiment. However, this configuration is not essential. The same effect can be obtained even if the support semiconductor substrate is a semiconductor having the face (311) or a face orientation crystallographically equivalent to this face, the semiconductor layer on the dielectric layer is a semiconductor having the face (110) or a face orientation crystallographically equivalent to this face, the n-type semiconductor component is formed on a semiconductor layer obtained based on epitaxial growth on the support semiconductor substrate, and the p-type semiconductor component is formed on a semiconductor layer obtained base on the epitaxial growth on the semiconductor layer on the dielectric layer.

Further, in this embodiment, the n-type semiconductor component is formed on the face (311) or a face having a face orientation crystallographically equivalent to the former face, but the present invention is not restricted to this face orientation, and the same effect can be generally obtained even if the n-type semiconductor component is formed on a face which is represented as a face (11N) by using N satisfying $1.2 < N < 10$ or a face having a face orientation crystallographically equivalent to this face.

Further, in this embodiment, since the semiconductor device is formed through the same processes as those in the conventional manufacturing method of a planar semiconductor device after formation of the SiGe layer to which the compressive strain is applied, there can be obtained an advantage that the processes can be simplified. On the other hand, when the semiconductor device is configured like the fourth embodiment, channels can be arranged in two directions orthogonal to each other while maintaining high mobility within both the n-type semiconductor component and the p-type semiconductor component, and an advantage that a degree of freedom in device arrangement is increased can be obtained.

Furthermore, in this embodiment, FIG. 33 shows that the directions [110] or the crystallographically equivalent directions in the surface of the support semiconductor substrate 18 and the semiconductor layer 20 on the dielectric layer are made to be parallel to each other, but this configuration is not essential, and they do not have to be made in parallel. However, when these directions are made in parallel, the components can be arranged in parallel to each other while maintaining high mobility, and hence an advantage that the device arrangement can be simplified is obtained.

Moreover, in this embodiment, the silicon layer is formed on the support semiconductor substrate based on a vapor phase epitaxial growth method in the process depicted in FIG. 36, but the present invention is not restricted to this method, and the silicon layer may be formed on the support semiconductor substrate based on, e.g., a deposition method and then crystallized by using, e.g., a solid phase epitaxial method.

In this embodiment, both the support semiconductor substrate 18 and the semiconductor layer 20 on the dielectric layer are made of silicon, but the material is not restricted to silicon. The same effect is also obtained when the support semiconductor substrate 18 is made of a mixed crystal of silicon and germanium, in which the composition ratio of germanium to silicon is represented as $y_1/(1-y_1)$, by using $y_1$ that satisfies $0 \leq y_1 < 1$, the semiconductor layer 20 on the dielectric layer is made of a mixed crystal of silicon and germanium, in which the composition ratio of germanium to silicon is represented as $y_2/(1-y_2)$, by using $y_2$ that satisfies $0 \leq y_2 < 1$, and the SiGe layer 6 is made of a mixed crystal of silicon and germanium, in which the composition ratio of silicon to germanium is represented as $(1-x)/x$, by using x that satisfies $y_1 < x \leq 1$ and $y_2 < x \leq 1$.

Further, the same effect is also obtained when the SiGe layer 6 on the support semiconductor substrate 18 is made of a mixed crystal of silicon and germanium, in which the composition ratio of silicon to germanium is represented as $(1-x_1)/x_1$, by using $x_1$ that satisfies $y_1 < x_1 \leq 1$, and the SiGe layer 6 on the semiconductor layer 20 on the dielectric layer is made of a mixed crystal of silicon and germanium, in which the composition ratio of silicon to germanium is represented as $(1-x_2)/x_2$, by using $x_2$ that satisfies $y_2 < x_2 \leq 1$.

The configuration described above offers an advantage of enabling to apply suitable strain to the SiGe layers 6 of the n-type semiconductor component 15 and the p-type semiconductor component 16, separately. On the other hand, the configuration in this embodiment offers an advantage of enabling to make the manufacturing process simple.

This embodiment can be modified in many ways as described in the foregoing embodiments, and the same effect can be obtained.

Seventh Embodiment

FIG. 39 is a cross-sectional view of a semiconductor device according to a seventh embodiment. An interlayer dielectric layer, a wiring metal, and others are omitted in the drawing. The semiconductor device according to this embodiment is formed on a face (311) or a silicon substrate 5 having a face orientation crystallographically equivalent to this face, and includes an n-type semiconductor component 15 and a p-type semiconductor component 16.

Here, both the n-type semiconductor component 15 and the p-type semiconductor component are formed on SiGe layers 6 formed on the silicon substrate 5. Further, each source/drain region 3 is formed in the SiGe layer 6. Here, a direction along which the respective source/drain regions 3 are connected in each of the n-type semiconductor component and the p-type semiconductor component, i.e., a main direction of a current flowing through a channel region is made to be direction [110] or a crystallographically equivalent direction. It is to be noted that FIG. 39 shows a configuration as if a bottom portion of each source/drain region 3 matches with a bottom portion of each SiGe layer, but the source/drain region 3 may be completely included in the SiGe layer 6 or it may be present to extend not only the SiGe layer 6 but also the silicon substrate 5. Furthermore, a gate electrode 2 is formed on each SiGe layer 6 through a gate dielectric layer 9.

A manufacturing method of a semiconductor device according to this embodiment will now be described hereinafter. First, as shown in FIG. 40, each isolation region 4 is formed by using, e.g., a shallow trench method. At this time, each isolation region 4 is arranged in such a manner that a channel is arranged in parallel to the direction [110] or the crystallographically equivalent direction.

Then, as shown in FIG. 41, the SiGe layer 6 in which composition ratios of silicon and germanium are 0.5 and 0.5, respectively, is formed on each of a surface of an active area 1 of the n-type semiconductor component and a surface of an active area 1 of the p-type semiconductor component by using, e.g., an $SiH_4$ gas, a $GeH_4$ gas, and an HCl gas based on an epitaxial growth method or the like. Subsequently, for example, $1\times10^{12}$ $cm^{-2}$ of B ions (not shown) are implanted into the silicon substrate 5 and the SiGe layer 6 of the n-type semiconductor component forming region with an energy of, e.g., 5 keV. Then, for example, $1\times10^{12}$ $cm^{-2}$ of P ions (not shown) are implanted into the silicon substrate 5 and the SiGe layer 6 of the p-type semiconductor component forming region with an energy of, e.g., 10 keV.

Figure 42:
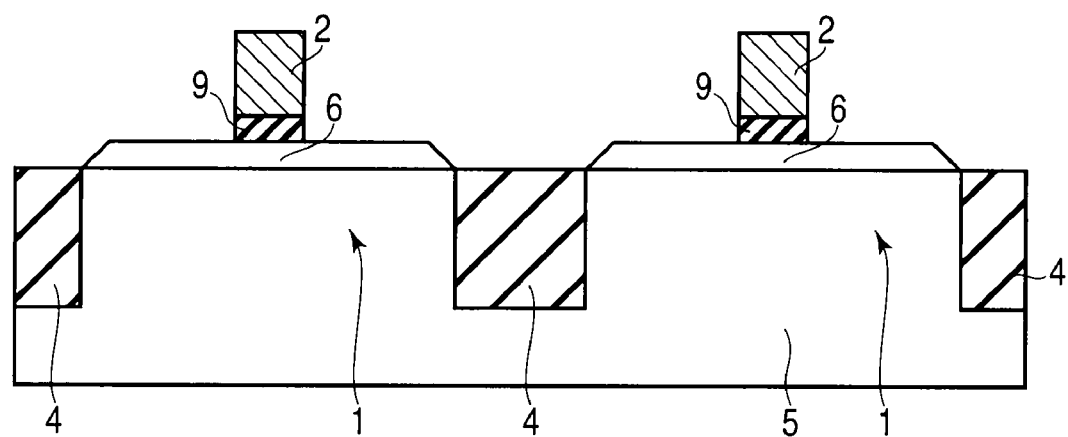

Subsequently, as shown in FIG. 42, a hafnium oxide film (not shown) having a thickness of, e.g., 5 nm is formed on the entire surface of each isolation region 4 or each SiGe layer 6 by, e.g., a CVD method. Then, a W film (not shown) having a thickness of, e.g., 10 nm is formed on the entire surface of the hafnium oxide film (not shown) by using the CVD method or the like. Subsequently, anisotropic etching such as an RIE method is carried out to process the W film and the hafnium oxide film, thereby forming the gate electrode 2 or the gate dielectric layer 9.

Then, for example, $1\times10^{15}$ $cm^{-2}$ of As ions are implanted into the n-type semiconductor component forming region with an energy of, e.g., 10 keV to form each source/drain region 3 of the n-type semiconductor component. Subsequently, for example, $1\times10^{15}$ $cm^{-2}$ of B ions are implanted into the p-type semiconductor component forming region with an energy of, e.g., 5 keV to form each source/drain region 3 of the p-type semiconductor component.

Thereafter, like the conventional technology, the semiconductor device according to the present embodiment shown in FIG. 39 is formed through, e.g., an interlayer dielectric layer forming process or a wiring process.

When the semiconductor device is formed as in this embodiment, each of the n-type semiconductor component and the p-type semiconductor component is formed on the face (311) or a face having a face orientation crystallographically equivalent to the former face to which the compressive strain is applied along the in-plane direction. Therefore, the electron mobility within the n-type semiconductor component has a very high value. On the other hand, the hole mobility within the p-type semiconductor component does not have the highest value. However, a surface where the p-type semiconductor component is formed is a face having a face orientation similar to that of the face (110) or a face having a face orientation crystallographically equivalent to the former face, and hence the hole mobility has a high value. As a result, both the electron mobility within the n-type semiconductor component and the hole mobility within the p-type semiconductor component have high values, thereby realizing a high-performance complementary semiconductor device which can operate at a high speed. When the semiconductor device according to each of the foregoing embodiments is formed, both the electron mobility within the n-type semiconductor component and the hole mobility within the p-type semiconductor component can have high values, and hence an advantage that a high-performance complementary semiconductor device which can operate at a very high speed is realized can be obtained. On the other hand, when the semiconductor device according to this embodiment is formed, an advantage that the manufacturing process is simplified can be obtained.

Further, although the semiconductor device is formed on the face (311) or a face having a face orientation crystallographically equivalent to the former face in this embodiment, the present invention is not restricted to this face orientation, and the same effect can be generally obtained even if the semiconductor device is formed on a surface which is represented as a face (11N) by using N satisfying 1.2<N<10 or a face having a crystallographically equivalent face orientation.

This embodiment can be modified in many ways as described in the foregoing embodiments, and the same effect can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor component comprising:
a mixed crystal layer of silicon and germanium having a first main surface, containing a III-group impurity, and having a first face orientation alone which is represented as a face (11N) by using N satisfying 1.2<N<10 or which is crystallographically equivalent to the face (11N) in the first main surface, a compressive strain being applied to the mixed crystal layer along an in-plane direction;

a gate dielectric layer formed on the first main surface;

a gate electrode formed on the gate dielectric layer; and source/drain regions formed to sandwich the gate electrode in a direction [110] of the mixed crystal layer or in a direction crystallographically equivalent to the direction [110] and containing a V-group impurity.

2. The semiconductor component according to claim 1, further comprising a mixed crystal member of silicon and germanium provided with a second main surface having the first face orientation, wherein the mixed crystal layer is formed on the second main surface of the mixed crystal member by epitaxial growth, a composition ratio of the silicon with respect to the germanium in the mixed crystal layer is represented as $(1-x)/x$, where a composition of the germanium in the mixed crystal layer is x ($0<x\leq1$), and a composition ratio of the germanium with respect to the silicon in the mixed crystal member is represented as $y/(1-y)$, where a composition of the germanium in the mixed crystal layer is y ($0\leq y<x$).

3. The semiconductor component according to claim 2, wherein $0.35\leq x-y\leq0.575$ is satisfied.

4. The semiconductor component according to claim 2, wherein the mixed crystal member has a first portion and a second portion, the first portion being provided with a third main surface having a second face orientation of a face (100) or a face crystallographically equivalent the face (100), and the second portion being epitaxially grown on the third main surface and being provided with the second main surface formed thereon.

5. The semiconductor component according to claim 4, wherein there are formed a plurality of protruding portions, each of the protruding portions being the second portion of the mixed crystal member.

6. The semiconductor component according to claim 4, wherein the second portion of the mixed crystal member has a plurality of plane surfaces, each of the plane surfaces being the second main surface and the mixed crystal layer being formed thereon, the gate dielectric layer is formed on the mixed crystal layer to extend over the mixed crystal member between the plane surfaces adjacent to each other, and an equivalent oxide thickness of the gate dielectric layer on at least one position of the mixed crystal member is larger than that on at least one position of the first main surface of the mixed crystal layer.

7. The semiconductor component according to claim 1, wherein the compressive strain is 1.4% or above with respect to a strain-free state.

8. A semiconductor device comprising a first semiconductor component and a second semiconductor component, which are insulated from each other, the first semiconductor component comprising:

a first mixed crystal layer of silicon and germanium containing a III-group impurity, provided with a first main surface having with a first face orientation alone which is represented as a face (11N) by using N satisfying $1.2<N<10$ or which is crystallographically equivalent to the face (11N) in the first main surface, a compressive strain being applied to the first mixed crystal layer along an in-plane direction of the first main surface;

a first dielectric layer formed on the first main surface;

a first gate electrode formed on the first dielectric layer; and first source/drain regions formed to sandwich the first gate electrode in a direction [110] of the first mixed crystal layer or in a direction crystallographically equivalent the direction [110] and containing a V-group impurity, and the second semiconductor component comprising:

a second mixed crystal layer of silicon and germanium containing a V-group impurity, and provided with a second main surface having a second main orientation of a face (110) or a face crystallographically equivalent to the face (110), a compressive strain being applied to the second mixed crystal layer along an in-plane direction of the second main surface;

a second dielectric layer formed on the second main surface;

a second gate electrode formed on the second dielectric layer; and second source/drain regions formed to sandwich the second gate electrode in a direction [110] of the second mixed crystal layer or in a direction crystallographically equivalent to the direction [110] and containing a III-group impurity.

9. The device according to claim 8, further comprising a mixed crystal member of silicon and germanium, wherein the first mixed crystal layer and the second mixed crystal layer are epitaxially grown on the mixed crystal member, and a composition ratio of the silicon with respect to the germanium in the first mixed crystal layer is represented as $(1-x_1)/x_1$, where a composition ratio of the germanium in the first mixed crystal layer is $x_1$ ($0<x_1\leq1$), a composition ratio of the silicon with respect to the germanium in the second mixed crystal layer is represented as $(1-x_2)/x_2$, where a composition ratio of the germanium in the second mixed crystal layer is $x_2$ ($0<x_2\leq1$), and a composition ratio of the germanium with respect to the silicon in the mixed crystal member is represented as $y/(1-y)$, where a composition ratio of the germanium in the mixed crystal member is y ($0\leq y<x_1$ and $0\leq y<x_2$).

10. The device according to claim 9, wherein $0.35\leq x_1-y\leq0.575$ and $0.35\leq x_2-y\leq0.575$ are satisfied.

11. The device according to claim 9, wherein the mixed crystal member includes a first portion and a second portion, the first portion being provided with a third main surface having a third face orientation of a face (100) or a face crystallographically equivalent to the face (100), and the second portion being provided with a fourth main surface having the first face orientation and having the first mixed crystal layer formed on the fourth main surface by epitaxial growth, and the mixed crystal member further includes a fifth main surface having a fourth face orientation of a face (110) or a face crystallographically equivalent to the face (110), and the second mixed crystal layer is formed on the fifth main surface.

12. The device according to claim 9, wherein the mixed crystal member has a first region and a second region, the first region being provided with a third main surface having the first face orientation and the second region being provided with a fourth main surface having a third face orientation of a face (110) or a face crystallographically equivalent to the face (110), the first mixed crystal layer is epitaxially grown on the third main surface, and the second mixed crystal layer is epitaxially grown on the fourth main surface.

13. The device according to claim 12, wherein the mixed crystal member has a horizontal substrate portion and a rectangular parallelepiped portion vertically connected with the substrate portion, the rectangular parallelepiped portion provided in the first region has the third main surface on a first side surface thereof, the first mixed crystal layer is formed on the first side surface, the rectangular parallelepiped portion provided in the second region has the fourth main surface on a second side surface thereof, and the second mixed crystal layer is formed on the second side surface.

14. The device according to claim 13, wherein each of the first mixed crystal layer and the second mixed crystal layer is further formed on the horizontal substrate portion in each of the first region and the second region, to be vertical to the first side surface and the second side surface of the rectangular parallelepiped portion, the first gate electrode is formed through the first dielectric film on the first mixed crystal layer at a corner portion where the rectangular parallelepiped portion and the substrate portion in the first region are connected with each other, and the second gate electrode is formed through the second dielectric film on the second mixed crystal layer at a corner portion where the rectangular parallelepiped portion and the substrate portion in the second region are connected with each other.

15. The device according to claim 14, wherein a portion of each of the first mixed crystal layer and the second mixed crystal layer formed on the rectangular parallelepiped portion and exposed from the gate electrode forms one of the source/drain regions, and a portion of the same formed on the substrate and exposed from the gate electrode forms the other of the source/drain regions.

16. The device according to claim 8, further comprising a third mixed crystal layer of silicon and germanium provided with a third main surface having the first face orientation and a fourth mixed crystal layer of silicon and germanium provided with a fourth main surface having the second face orientation,
wherein the first mixed crystal layer is formed on the third main surface,
the second mixed crystal layer is formed on the fourth main surface,
a composition ratio of the silicon with respect to the germanium in the first mixed crystal layer is represented as $(1-x_1)/x_1$, where a composition ratio of the germanium in the first mixed layer is $x_1$ ($0<x_1 \leq 1$), and a composition ratio of the silicon with respect to the germanium in the second mixed crystal layer of the silicon and the germanium is represented as $(1-x_2)/x_2$, where a composition ratio of the germanium in the second mixed layer is $x_2$ ($0<x_2 \leq 1$),
a composition ratio of the germanium with respect to the silicon in the third mixed crystal layer is represented as $y_1/(1-y_1)$, where a composition ratio of germanium in the third mixed crystal layer is $y_1$ ($0 \leq y_1 < x_1$),
a composition ratio of the germanium with respect to the silicon in the fourth mixed crystal layer is represented as $y_2/(1-y_2)$, where a composition ratio of germanium in the fourth mixed crystal layer is $y_2$ ($0 \leq y_2 < x_2$), and
the third mixed crystal layer is in contact with the fourth mixed crystal layer through the third dielectric layer.

17. The device according to claim 16, wherein $0.35 \leq x_1 - y_1 \leq 0.575$ and $0.35 \leq x_2 - y_2 \leq 0.575$ are satisfied.

18. The device according to claim 8, further comprising a mixed crystal member of silicon and germanium, wherein the first mixed crystal layer is formed on a well composed of a mixed crystal of silicon and germanium insulatively formed on the mixed crystal member, and the second crystal layer is formed on an epitaxial growth layer on the mixed crystal member.

19. A semiconductor device comprising a first semiconductor component and a second semiconductor component insulated from each other,
the first semiconductor component comprising:
a first mixed crystal layer of silicon and germanium provided with a first main surface having a surface of a first face orientation represented as a face (11N) by using N satisfying $1.2<N<10$ or a face crystallographically equivalent to the face (11N), a compressive strain being applied to the first main surface along an in-plane direction;
a first semiconductor region formed in the first mixed crystal layer and containing a III-group impurity;
a first dielectric layer formed on the first semiconductor region;
a first gate electrode formed on the first dielectric layer; and
first source/drain regions formed to sandwich the first gate electrode in a direction [110] of the first mixed crystal layer or in a direction crystallographically equivalent to the direction [110], and containing a V-group impurity, and
the second semiconductor component comprising:
a second mixed crystal layer of silicon and germanium having the first face orientation, a compressive strain being applied to the first main surface along an in-plane direction;
a second semiconductor region formed on the second mixed crystal layer and containing a V-group impurity;
a second dielectric layer formed on the second semiconductor region;
a second gate electrode formed on the second dielectric layer; and
second source/drain regions formed to sandwich the second gate electrode in a direction [110] or in a direction crystallographically equivalent to the direction [110] and containing a III-group impurity.

20. The device according to claim 19, wherein the compressive strain is 1.4% or above with respect to a strain-free state.

* * * * *